(12) United States Patent
Hopkins et al.

(10) Patent No.: US 11,182,326 B2
(45) Date of Patent: Nov. 23, 2021

(54) INPUT/OUTPUT APPARATUS AND METHODS FOR MONITORING AND/OR CONTROLLING DYNAMIC ENVIRONMENTS

(71) Applicant: Opteon Corporation, Cambridge, MA (US)

(72) Inventors: T. Eric Hopkins, Wellesley, MA (US); Timothy N. Schaeffer, Somerville, MA (US); Jeffrey Cho, Northborough, MA (US)

(73) Assignee: OPTEON CORPORATION, Cambridge, MA (US)

( * ) Notice: Subject to any disclaimer, the term of this patent is extended or adjusted under 35 U.S.C. 154(b) by 0 days.

(21) Appl. No.: 17/229,704

(22) Filed: Apr. 13, 2021

(65) Prior Publication Data

US 2021/0232524 A1    Jul. 29, 2021

Related U.S. Application Data

(63) Continuation of application No. PCT/US2020/059221, filed on Nov. 5, 2020.

(60) Provisional application No. 62/931,188, filed on Nov. 5, 2019.

(51) Int. Cl.
*G06F 13/40* (2006.01)
*G05B 19/042* (2006.01)
*H03K 19/173* (2006.01)

(52) U.S. Cl.
CPC ....... *G06F 13/4027* (2013.01); *G05B 19/042* (2013.01); *G05B 2219/23293* (2013.01); *H03K 19/1737* (2013.01)

(58) Field of Classification Search
CPC .............. G06F 13/4027; G05B 19/042; G05B 2219/23293; H03K 19/1737
See application file for complete search history.

(56) References Cited

U.S. PATENT DOCUMENTS

| | | | |
|---|---|---|---|
| 4,091,455 | A | 5/1978 | Woods et al. |
| 7,779,318 | B2 | 8/2010 | Syed et al. |
| 7,991,937 | B1 | 8/2011 | Yin et al. |
| 9,459,607 | B2 | 10/2016 | Frazer et al. |
| 9,494,926 | B2 | 11/2016 | Frazer et al. |
| 10,983,493 | B2 | 4/2021 | Frazer et al. |
| 2003/0074489 | A1* | 4/2003 | Steger .................. G01D 9/005 710/1 |
| 2009/0015426 | A1 | 1/2009 | Long et al. |

(Continued)

OTHER PUBLICATIONS

ADA4622-1/ADA4622-2/ADA4622-4 Data Sheet. Analog Devices 2015. 38 pages.

(Continued)

*Primary Examiner* — Glenn A. Auve
(74) *Attorney, Agent, or Firm* — Smith Baluch LLP

(57) ABSTRACT

Apparatus and methods for flexible input/output signaling over a same signaling channel are described. A programmable interface circuit includes a signaling channel that can be adapted, prior to use or during operation, for transmission and/or reception of different types of analog and digital signals. The interface circuit can be used for communications between an isolating communication controller and components of a machine that use diverse signaling types.

50 Claims, 12 Drawing Sheets

(56) References Cited

U.S. PATENT DOCUMENTS

2014/0109029 A1* 4/2014 Bai .................... G06F 30/34
716/112
2016/0306922 A1   10/2016 Rooyen et al.
2017/0023918 A1   1/2017 Frazer et al.
2019/0041819 A1   2/2019 Frazer et al.

OTHER PUBLICATIONS

BSN20 N-Channel Enhancement Mode Field MOSFET. Diodes Incorporated Dec. 2019. 7 pages.
CPH5518 Bipolar Transistor. On Semiconductor Sep. 2013. 8 pages.
International Search Report and Written Opinion in International Patent Application No. PCT/US2020/059221 dated Feb. 2, 2021, 12 pages.
LT6106 36V Low Cost High Side Current Sense in a SOT-23. Linear Technology 2007. 14 pages.
LTC2876/LTC2877 ±60V Rugged Profibus RS485 Transceivers. Linear Technology Aug. 2016. 32 pages.
NX3008NBKS Product Data Sheet. Nexperia Aug. 2011. 17 pages.
Si3459BDV P-Channel 60 V (D-S) MOSFET. Vishay Siliconiz Mary 4, 2009. 11 pages.
SN74LVC1G3157 Single-Pole Double-Throw Analog Switch. Texas Instruments. Jan. 2003. 45 pages.
XTR117 4-20mA Current-Loop Transmitter. Burr-Brown Products from Texas Instruments Sep. 2005. 19 pages.

* cited by examiner

INPUT/OUTPUT APPARATUS AND METHODS FOR MONITORING AND/OR CONTROLLING DYNAMIC ENVIRONMENTS

CROSS-REFERENCE TO RELATED APPLICATION

The present application is a bypass continuation application of international application No. PCT/2020/059221 filed on Nov. 5, 2020, titled "Input/Output Apparatus and Methods for Monitoring and/or Controlling Dynamic Environments," which claims a priority benefit to U.S. provisional application Ser. No. 62/931,188, filed on Nov. 5, 2019, titled "Input/Output Methods and Apparatus for Monitoring and/or Controlling Dynamic Environments," which applications are incorporated herein by reference in their entirety.

BACKGROUND

Some modern automated or semi-automated machines (e.g., in industrial environments such as factory assembly and/or inspection lines) may include tens or hundreds of components, which may be controlled and/or monitored by one or more remote devices. For example, there may be disparate components (such as sensors, actuators, encoders, motors, power sources, light sources, imagers, image processors, conveyors, controllers, signal processors, signal generators, etc.) to which data and/or control signals may be sent, and/or from which data and/or control signals may be received.

Modern manufacturing machines used in various types of factories can comprise hundreds of such disparate components that may be obtained from dozens of different vendors. The diverse ecosystem of various components allows designers of modern machines to assemble multiple components in a machine that can meet an almost unlimited set of design goals, without the need to invent custom components for every unique application. Examples of machines that may be constructed of multiple components include manufacturing machines, autonomous vehicles, modern automobiles, aircraft, wind turbines, and power plants.

Frequently, components for machines are produced in larger volumes than any one end-user application requires, so that fixed and variable costs associated with component manufacture are reduced. This business model is based on an expectation that the large volumes of components will be sold to many end-users and/or used in many different end-user applications. A consequence of large-volume production is that many components for machines are designed independently of any particular end-user application. Accordingly, such components will typically not be optimized for any particular application. Lack of component optimization at the design phase can lead to use of relatively larger numbers of components in an automated or semi-automated machine, in which the overall functionality or capability of a component may be underutilized. Further, the addition of one or more adapting components may be required to adapt the functionality of one or more included components to accomplish a particular design goal for an automated or semi-automated machine. In sum, non-customized generality for components of machines can result in appreciable added complexity and cost to the automated or semi-automated machine comprising such components.

SUMMARY

Described herein are inventive apparatus and methods relating to programmable input/output interface circuits for automated or semi-automated machines. Examples of programmable interface circuits can be used to assist in controlling the dynamic environment of an automated or semi-automated machine, for example, and may be installed between a controller and one or more components of the machine that are to be controlled and/or from which data may be received. Such components include sensors and actuators such as, but not limited to, thermal sensors, light sensors, wind sensors, pressure sensors, speed sensors, proximity detectors, strain gauges, x-ray detectors, radiation sensors, chemical sensors, moisture or humidity sensors, flame sensors, smoke or dust sensors, light sources, light curtains, galvinometers, encoders, motors, power sources, light sources, imagers, image processors, conveyors, controllers, signal processors, signal generators, robotics equipment, etc. According to some implementations, the programmable interface circuits of the present implementations can be programmed (either prior to use or in real time during operation of the machine) to interface with a wide variety of components that use different signaling types (e.g., different types of digital and analog signaling schemes). In some implementations, the interface circuits can transmit and receive different signaling types through a same signaling channel. The ability to transmit and receive different signaling types through a same signaling channel can result in fewer interconnect cables, less interconnection complexity, a smaller footprint for control apparatus, reduced cost of implementation and operation, and more reliable operation.

In sum, various implementations are directed to programmable interface circuits that can adaptively communicate signals between an isolating communication controller and a component of a machine. In one example implementation, the programmable interface circuit comprises a plurality of interconnects to receive programming inputs from the isolating communication controller and a signaling channel to carry signals between the programmable interface circuit and the component. The programmable interface circuit also comprises a programmable analog I/O circuit to connect to the signaling channel and to receive a first signal from the isolating communication controller, a programmable digital I/O circuit to connect to the signaling channel and to receive a second signal from the isolating communication controller and a current-sensing circuit to sense an amount of current flowing in the signaling channel. During operation, the programmable interface circuit is programmable, based on at least a first one of the programming inputs when applied to the plurality of interconnects, to provide a first analog signal to the signaling channel based on the first signal received from the isolating communication controller or a first digital signal to the signaling channel based on the second signal received from the isolating communication controller.

In an example implementation, the programmable interface circuit comprises a plurality of interconnects and a signaling channel to carry signals between the programmable interface circuit and the component. The programmable interface circuit also comprises a programmable analog I/O circuit to connect to the signaling channel and to receive a first signal from the isolating communication controller and a programmable digital I/O circuit to connect to the signaling channel and to receive a second signal from the isolating communication controller. During operation, the programmable interface circuit is programmable, based on at least a first one of the programming inputs when applied to the plurality of interconnects, to provide a first analog signal to the signaling channel based on the first signal received from the isolating communication controller or a first digital signal to the signaling channel based on the second signal received from the isolating communication controller.

Some implementations are directed to methods of operating programmable interface circuits. An example method of operating a programmable interface circuit can include an act of receiving a first programming input that programs an interface circuit to receive a first signal from an isolating communication controller for transmission to a component of a machine, wherein the first signal can be either an analog signal or digital signal. The example method can further include acts of receiving the first signal from the isolating communication controller and transmitting a first output signal that is based on the received first signal to a signaling channel of the programmable interface circuit, wherein the first output signal is of a same signaling type as the received first signal. The example method can also include receiving a second programming input that programs the interface circuit to receive a second signal from the component at the signaling channel, wherein the second signal is of a different signaling type than the first signal, and transmitting a first input signal to the isolating communication controller that is based on the received second signal.

The foregoing and other aspects, implementations, and features of the present teachings can be more fully understood from the following description in conjunction with the accompanying drawings. It should be appreciated that all combinations of the foregoing aspects, implementations, and features and additional aspects, implementations, and features discussed in greater detail below (provided such aspects, implementations, and features are not mutually inconsistent) are contemplated as being part of the inventive subject matter disclosed herein. In particular, all combinations of claimed subject matter appearing at the end of this disclosure are contemplated as being part of the inventive subject matter disclosed herein.

BRIEF DESCRIPTION OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

DETAILED DESCRIPTION

Following below are detailed descriptions of various concepts related to, and implementations of, inventive input/output methods and apparatus for monitoring and/or controlling dynamic environments. It should be appreciated that various concepts discussed herein may be implemented in multiple ways. Examples of specific implementations and applications are provided herein primarily for illustrative purposes.

In particular, the figures and example implementations described above and below are not meant to limit the scope of the present disclosure to the example implementations discussed herein. Other implementations are possible by way of interchange of at least some of the described or illustrated elements. Moreover, where certain elements of the disclosed example implementations may be partially or fully instantiated using known components, in some instances only those portions of such known components that are necessary for an understanding of the present implementations are described, and detailed descriptions of other portions of such known components are omitted so as not to obscure the salient inventive concepts underlying the example implementations.

Figure 1:
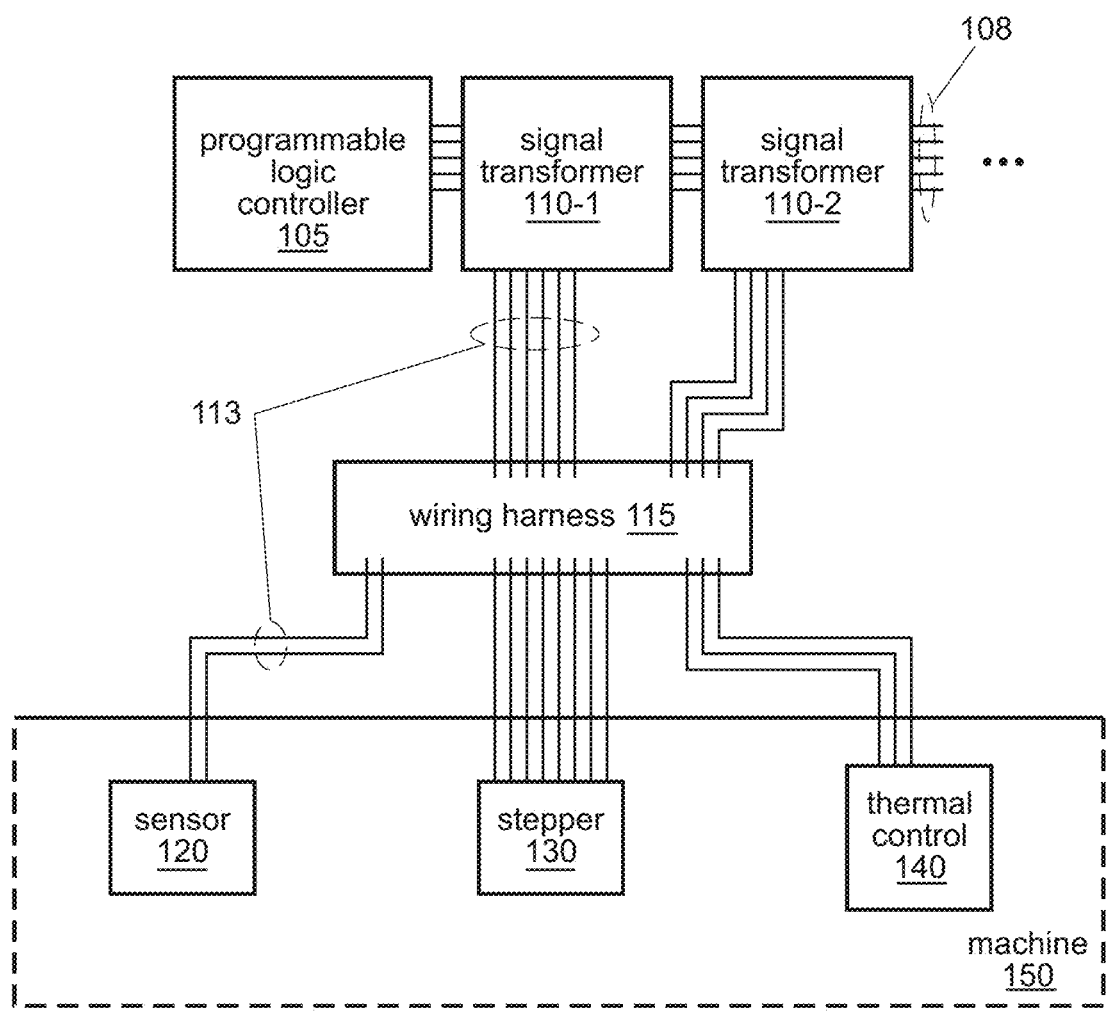
FIG. 1 depicts an example of a portion of conventional control architecture and apparatus for automation of a machine.

FIG. 1 depicts a simplified example of a portion of conventional control architecture and apparatus for automation of a machine 150 that may be implemented in a manufacturing facility, for example. In FIG. 1, a programmable logic controller (PLC) 105 may send and receive signals to at least one signal transformer 110-1 to ultimately communicate with a component of the machine 150. Although only one PLC is shown in the drawing, it should be appreciated that there may be multiple such PLCs disposed at various locations in the manufacturing facility (e.g., tens or even hundreds of PLCs in some implementations). In some cases, each PLC can couple to a plurality of signal transformers 110-1, 110-2, . . . which in turn couple via one or more wiring harnesses 115 to components 120, 130, 140 in an automated or semi-automated machine 150.

In FIG. 1, for purposes of illustration the machine 150 is shown as including three example components, namely, a sensor 120, a stepper motor 130, and a thermal control instrument 140 (heater and/or cooler). In practical applications, the machine 150 (as well as other machines in the manufacturing facility) may have fewer, greater, and/or different types of components coupled to the programmable logic controller 105 (although, generally speaking, at least one or more sensors 120 typically would be included in the machine 150). The components of the machine 150 operate in a dynamic environment in response to command signals and/or sensed signals. Actions of one component may depend upon actions of another component and/or changes in the dynamic environment sensed by one or more sensors 120.

In implementations like that show in FIG. 1, a programmable logic controller 105 may connect to and communicate with a plurality of signal transformers 110-1, 110-2, . . . 110-N over a plurality of interconnects 108. A signal transformer may be designed to handle a specific signaling type, and there may be differently designed signal transformers for each signaling type. For example, there may be a first signal transformer 110-1 for an analog first signaling type and a second signal transformer 110-2 for a digital first signaling type. There may be a third signal transformer for an analog second signaling type that is different from the analog first signaling type, and so on. Each signal transformer may have a plurality of pins (e.g., physical conductive interconnects for input/output signaling channels) that may be used to connect wires and/or cables 113 to the wiring harness 115 directly, as depicted. The PLC 105, signal transformers 110, and wiring harness 115 may appear as that shown in the photograph of FIG. 2A. Typically, there can be a different number of wires and/or cables 113 connecting to the signal transformers and to respective components of the machine 150.

Figure 2A:
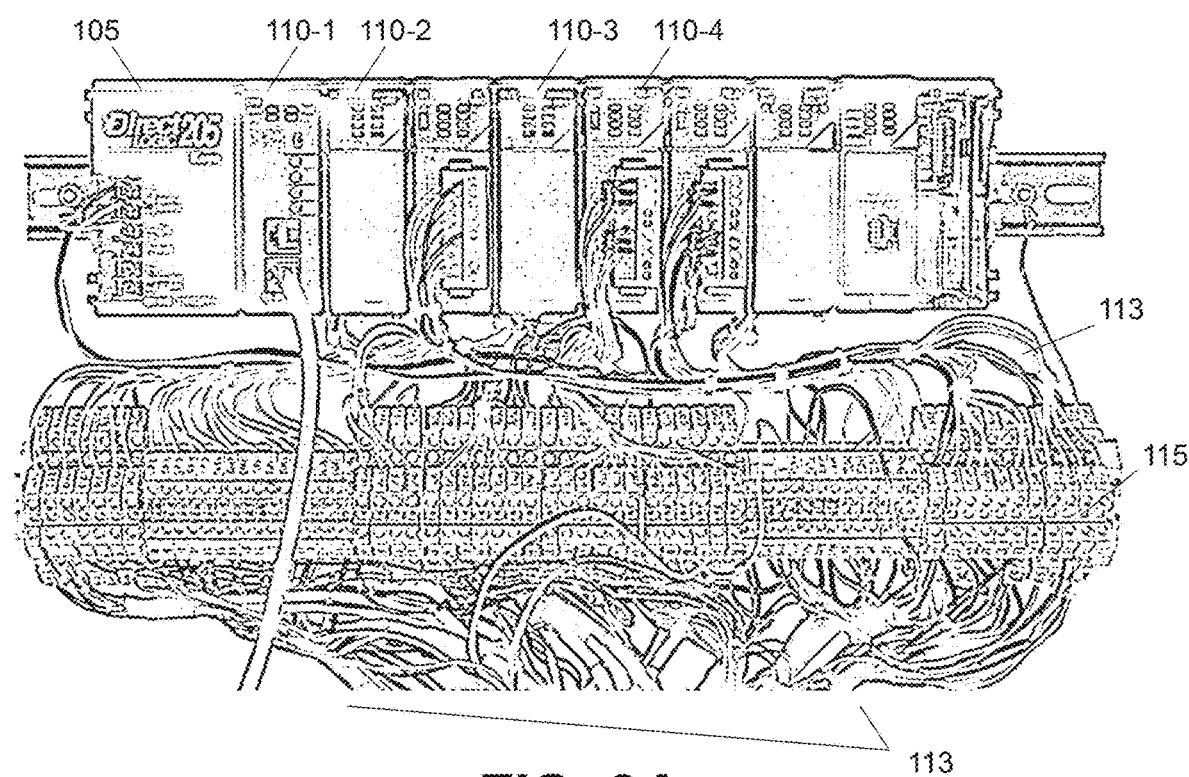
FIG. 2A depicts an example of a wiring harness that may be used for the conventional control architecture shown in FIG. 1.
Figure 2B:
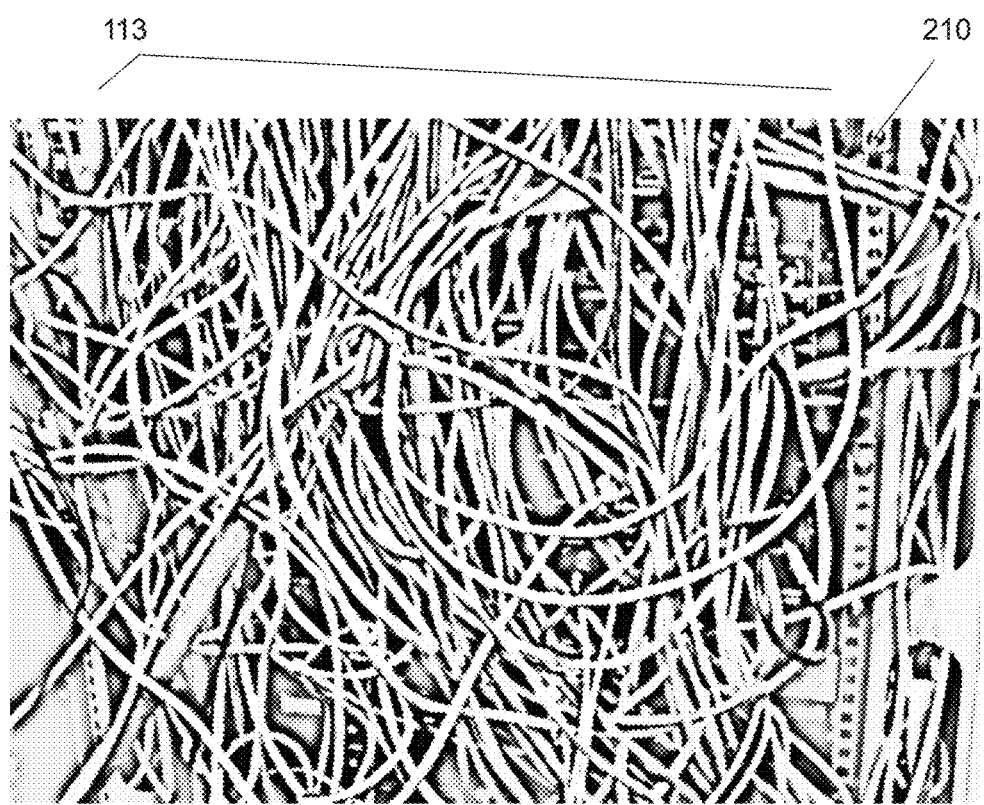
FIG. 2B depicts an example of wiring in an instrument rack of the conventional control architecture shown in FIG. 1.

FIG. 2B shows an example of wiring congestion that can occur in connection with an equipment rack 210, which is barely visible in the photograph. Often, equipment racks and/or electronics cabinets may be used to mount programmable logic controllers 105, signal transformers 110, wiring harnesses 115, and other interface apparatus for an automated machine. For some automated or semi-automated manufacturing machines, multiple racks containing multiple PLC's, signal transformers, wiring harnesses, and complex cabling (e.g., a daunting amount of interconnection cables and set of custom cable harnesses) may be required. When multiple PLCs, signal transformers, and wiring harnesses are installed in an equipment rack 210, the rack can become very congested with cabling, making it very difficult to service. In addition to the complexity at initial set-up, troubleshooting and repairing such equipment can be a highly complex, time-consuming, and costly task. In some cases, the racks, cabling, harnesses, and PLCs may be assembled and housed in several large, expensive electrical cabinets, resulting in apparatus as shown in FIG. 2A and FIG. 2B.

The challenges of machine automation can include reliably connecting, coordinating, and controlling (often at an appreciably high speed of operation) several disparate components in an automated or semi-automated machine. Overcoming such challenges can add substantial engineering time, complexity, and cost to the machine, as described above. The challenges may be more difficult for new machine designs. In some use cases, power and communication standards may constrain, at least partially, the scope of system complexity. Notwithstanding, the task of harmonizing multiple power and/or communication standards where they exist, coupled with the presence of multiple disparate machine components and their respective power and communications/signaling requirements, can engender a significant investment of time, effort, and cost.

The Applicant has recognized and appreciated that the complexity of combining disparate components in systems for automation, including manufacturing machines in various factory environments, may also limit the reliability of the resulting systems, leading to lower uptime and significant repair and maintenance costs. Such reduced reliability can mean that using systems composed of several automated conventional and disparate components increases risks of operating the machine (e.g., increased risk of downtime and cost associated with repairs).

The process of designing the arrangement of components in an automated or semi-automated machine, assembling these disparate components, and getting them all to function properly can require significant human capital that, in some cases, exceeds the parts costs of the machines themselves. The Applicant has also recognized and appreciated that such steep economics are a substantial constraint on the utilization of automation in automated or semi-automated machines. Some or all of the foregoing complexity, risk, and cost factors may be gating considerations for machine automation in various areas of the economy (e.g., beyond a factory automated or semi-automated environment) in which automation may be applied. Such areas may include, but are not limited to, offices, homes, autonomous vehicles, modern automobiles, communication systems, fluid handling or processing systems, waste processing plants, power plants, and gas and/or electric power grids.

In further consideration of the interconnection of various components in a machine, the Applicant has also recognized and appreciated that multiple Industrial Ethernet standards have been developed and deployed to good effect to control machine components (which may be referred to in some instances as "peripheral devices."). While some components or peripheral devices may be controlled according to such Industrial Ethernet standards, other components of a machine may require relatively simpler control interfaces, examples of which include, but are not limited to, control interfaces that accommodate single-ended and differential binary voltage-based and current-based connections, as well as signaling via analog current and voltage signals. For various reasons, most if not all of these connections should maintain electrical isolation between components while permitting the free flow of data and, in some cases, power as well.

In view of the potential complexity of wiring and interfacing with multiple different components for automation of a machine, the Applicant has recognized and appreciated several of the above-mentioned challenges associated with machine automation that could be mitigated with a programmable interface circuit and module. The Applicant recognizes and appreciates that an important part of rapidly deploying less expensive and more reliable automated or semi-automated machines includes improving integration of at least some fundamental system components, making greater use of networking and distributed control (e.g., as opposed to having power and control in a centralized large electrical cabinet with complex cabling), and utilizing adaptive and programmable (flexible) interface circuitry for input and output signaling.

Figure 3:
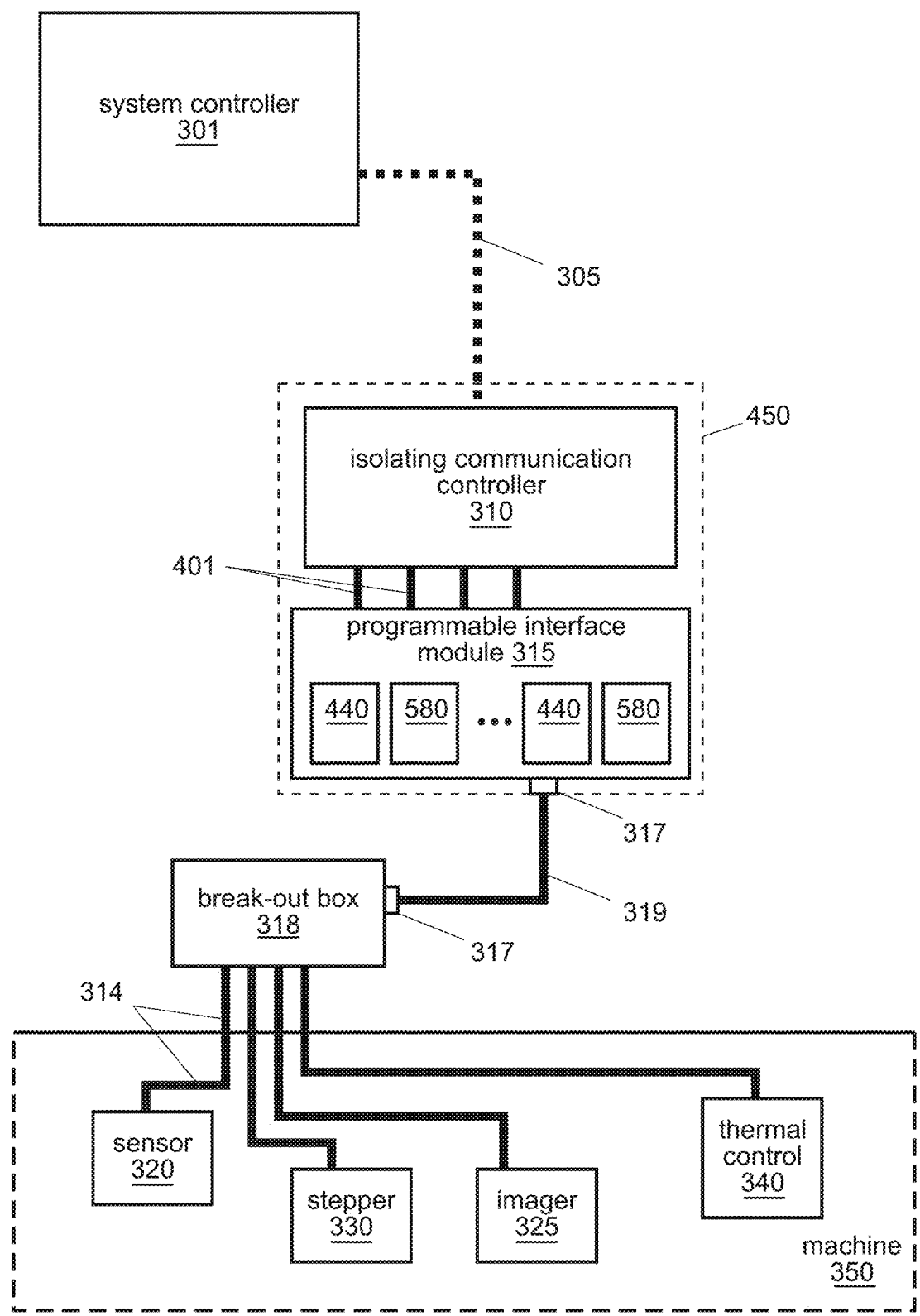
FIG. 3 depicts an example of a portion of control architecture and apparatus for automation of a machine that includes a programmable interface module 315 and programmable interface circuits 440, according to some inventive implementations.

In view of the foregoing, FIG. 3 depicts a portion of apparatus and control architecture for an automated or semi-automated machine that implements improved integration and networking of system components and adaptive and programmable (flexible) interface circuitry for input and output signaling. In FIG. 3, a system controller 301 provides various control and programming signals, and receives information from, one or more components of machine 350. In some implementations, system controller 301 communicates via one or more serial communication channels over wired or wireless link 305. Examples of controllers that may serve as system controller 301 include, but are not limited to, a PLC, a personal computer, a laptop computer, a microprocessor, a microcontroller, a distributed machine controller, or some combination thereof. In one exemplary implementation, the system controller 301 may include the Maestro 16 available from Opteon Corporation of Cambridge, Mass. Information about the Maestro 16 controller currently can be found at www.opteontech.com/seamless-systems/beyond-plcs. Inventive technology employed by the Maestro 16 is described in U.S. Pat. No. 9,459,607, titled "Methods, Apparatus, and Systems for Monitoring and/or Controlling Dynamic Environments," issued Oct. 4, 2016, which is incorporated herein by reference in its entirety. Amongst other benefits, employing the Maestro 16 in the system controller 301 provides for a compact, cost effective, and extremely low latency control solution for automation of machines.

As illustrated in FIG. 3, an isolating communication controller 310 can receive signals from, and transmit signals to, the system controller 301 via the wired or wireless link 305. The isolating communication controller 310 can provide electrical isolation (e.g., isolation of voltages and currents) between the link 305 and factory wiring that ultimately connects to the machine 350. In some implementations, the isolating communication controller 310 can receive time-multiplexed serialized signals from the system controller 301, electrically isolate the received signals, and convert the serialized isolated signals to parallelized programming inputs that are applied to a programmable interface module 315 to program operating modes of the module 315, as discussed further below. The isolating communication controller 310 can also receive parallelized data from one or more programmable interface modules 315 and serialize the data, and electrically isolate the serialized data for transmission to the system controller 301 via the link 305. The isolating communication controller 310 may use signal multiplexers to convert serial signals to parallel signals and vice versa, and may employ opto-isolators and/or other opto-isolation circuit components to achieve electrical isolation.

With regard to adaptive and programmable interface circuitry, the isolating communication controller 310 can connect to a programmable interface module 315, including programmable interface circuits 440, 580 as described further below, to provide control signals of different signaling types and power to, and/or receive input signals of different signaling types from, a wide variety of components in an automated or semi-automated machine 350. An advantageous aspect of the programmable interface module 315 and its circuitry is that it includes one or more adaptive signaling channels (so-called "flexible I/O" channels) where each signaling channel can be programmed to send and/or receive different analog and digital signaling types. The combination of the isolating communication controller 310 and the programmable interface module 315 is referred to herein as a "flex I/O controller" 450, which allows for electrical isolation and diverse signaling to and from one or more components in the machine 350 that respectively employ different signaling types. In different implementations of a flex I/O controller 450, the programmable interface module 315 may be incorporated as circuitry in a same package with the isolating communication controller 310, or may be packaged as a separate module that can be mounted in close proximity to the isolating communication controller.

In one aspect, the flex I/O controller 450 allows the system controller 301 to achieve compatibility with virtually any component or device of the machine 350 to which the programmable interface module 315 may be connected. According to some inventive implementations described below, a same type of cable and connectors may be used between each interface module 315 and component(s) or break-out-box 318 to which the interface modules connect. As compared to conventional system implementations as illustrated in FIG. 2A and FIG. 2B, the flex I/O controller 450 thus provides an elegant and robust solution to the problem of requiring multiple signal transformers that respectively engender complicated and complex wiring arrangements, and the various challenges associated with such arrangements (including vulnerability to breakage or other failure, and significant difficulty in troubleshooting breakages and other failures).

As shown in FIG. 3, the programmable interface module 315 may be located between the isolating communication controller 310 and one or more components 320, 325, 330, 340 of the machine 350. According to some implementations, a programmable interface module 315 may be configured to interface with up to 16 machine components. However, in some cases, a programmable interface module 315 may be configured to interface with any suitable number of components (e.g., 2, 4, 5, 6, 8, 9, 10, 12, 16, 20, 32, etc.). For example, as discussed in greater detail below in connection with FIG. 4B, a programmable interface module 315 may comprise N copies of a programmable interface circuit 440, wherein each circuit 440 is used to interface between an isolating communication controller 310 and a machine component. In some cases, a programmable interface module 315 may further comprise M copies of a different implementation of a programmable interface circuit 580, wherein each circuit 580 is used to interface between an isolating communication controller 310 and a machine component. The values of N and M can be same or different positive integers between 1 and 50 in some implementations.

Apparatus for machine automation may also include break-out boxes 318 to which a programmable interface module 315 connects. One programmable interface module 315 may connect to one or more break-out boxes 318 using additional cables 319. According to one example implementation, each cable 319 from an interface module 315 may support flexible I/O signaling with up to four machine components and connect to one break-out box 318. Separate cables 314 may run from the break-out box 318 to each component 320, 330, 340.

A programmable interface module 315 can include one or more signaling ports 317 to which one or more cables 319 connect. A signaling port 317 may comprise a plurality of conductive interconnects to carry different types of analog and/or digital signals, as well as power and reference potentials. According to an example implementation, there may be up to four or more signaling ports 317 on a programmable interface module 315, such that a programmable interface module may provide flexible I/O signaling channels for up to 16 machine components, though interface modules supporting signaling with fewer or more machine components and signaling ports 317 are possible.

In some implementations, a same type of connector (male or female) can be used for each signaling port 317 and a corresponding mating connector used for an end of each cable 319, 314. According to some implementations, the cables 319 may all be of a same type for each signaling port and each programmable interface module 315. In some cases, the cables may be 8-wire or 12-wire ethernet or industrial ethernet cables (e.g., CAT 5 series or CAT 6 series cables) having standard ethernet or industrial ethernet connectors (e.g., RJ-45, M8, or M12 male or female plugs) that plug into standard receptacles (e.g., RJ-45, M8, or M12 female or male receptacles) in the programmable interface module 315. Accordingly, a significant simplification, reduction, or elimination of diverse connectivity apparatus (such as wires and wiring harnesses) can be achieved using programmable interface modules 315 of the present implementations.

It will be appreciated that some implementations may employ cables and connectors other than ethernet cables or use cables and connectors with a different number of signal wires. In some cases, one or more wireless links may be implemented between a programmable interface module 315 and one or more components in a machine and/or the controller 310. Additionally or alternatively, different types of cables and connectors may be used for a single programmable interface module 315 having flexible I/O signaling capability.

According to some implementations, there can be data and power interconnects 401 between a programmable interface module 315 and an isolating communication controller 310. Such interconnects can be contained within a package or housing that includes both the isolating communication controller and the programmable interface module. Alternatively, the data and power interconnects may be made using one, two, or more multi-wire cables and connectors when the controller 310 and interface module 315 are packaged separately.

As noted above, employing a flex I/O controller 450 including a programmable interface module 315, as shown in FIG. 3 and in accordance with the implementations described herein, may significantly reduce the need for, or eliminate, use of diverse discrete signal transformers 110, complex wiring harnesses, diverse connectors and cables, and adapting component that are typically required in conventional automated or semi-automated machine architectures. An example of such reduction can be envisioned from a comparison of the architecture of FIG. 3 with that of FIG. 1. As described in greater detail below, reduction in automation complexity is made possible by the programmable interface module 315 that can essentially enhance the functionality of an isolating communication controller's input/output channels such that a channel can be controllably adaptive ("flexible") for handling different types of analog and digital signals. Such adaptability of an input/output channel may be referred to herein as "Flex I/O," "flexible I/O signaling," or "flexible I/O channel."

Multiple isolating communication controllers 310 and programmable interface modules 315 comprising such Flex I/O signaling channels may be employed together as a network of isolating communication controllers to control an automated or semi-automated machine, for manufacturing applications or other automated applications, with notably less complexity associated with the interconnections of respective components of the machine, as well as with low latency and increased reliability of operation. Such automated or semi-automated applications include, but are not limited to, manufacturing facilities, offices, homes, autonomous vehicles, modern automobiles that employ a plurality of processors and electronic control modules, communication systems, fluid handling or processing systems, waste processing plants, power plants, and gas and/or electric power grids.

Figure 4A:
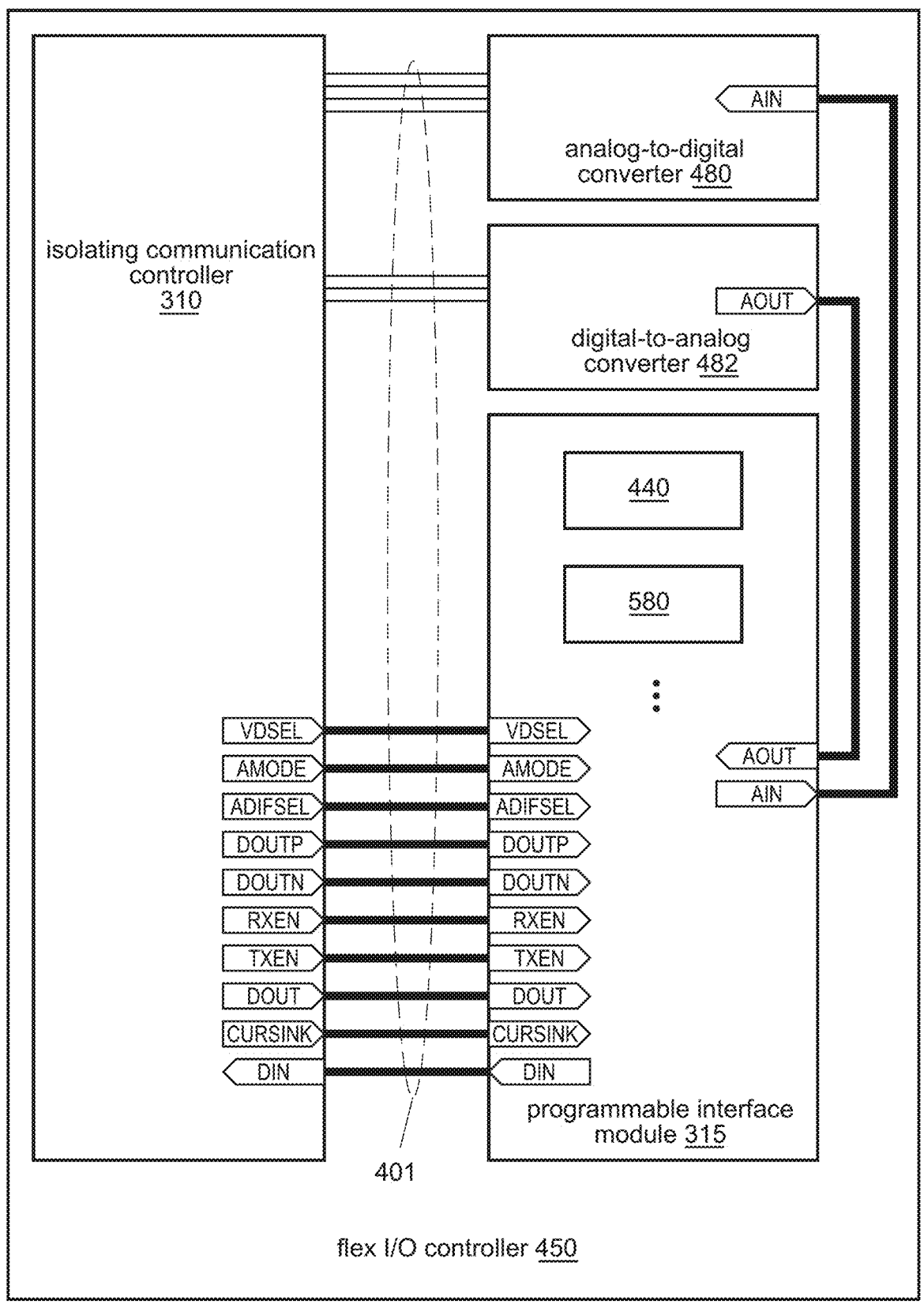
FIG. 4A depicts example interconnections for a flex I/O controller package that includes a programmable interface module, analog-to-digital converters, digital-to-analog converters, and an isolating communication controller.

FIG. 4A depicts an example of a flex I/O controller 450 in which an isolating communication controller 310 is packaged with at least one programmable interface module 315. The illustration shows further details of some interconnects 401 between a programmable interface module 315 and isolating communication controller 310. The interconnects 401 can comprise multiple wires (e.g., ribbon cables) for the multiple interconnects 401 on each programmable interface circuit 440. According to some implementations, digital input lines (DIN) originating from the programmable interface circuits 440, 580 can connect directly to an isolating communication controller 310. In some cases, analog input (AIN) and output (AOUT) lines may be provided to an analog-to-digital converter (ADC) 480 and digital-to-analog converter (DAC) 482, respectively, where conversion to or from digital signals occurs for communicating with the controller 310.

Figure 4B:
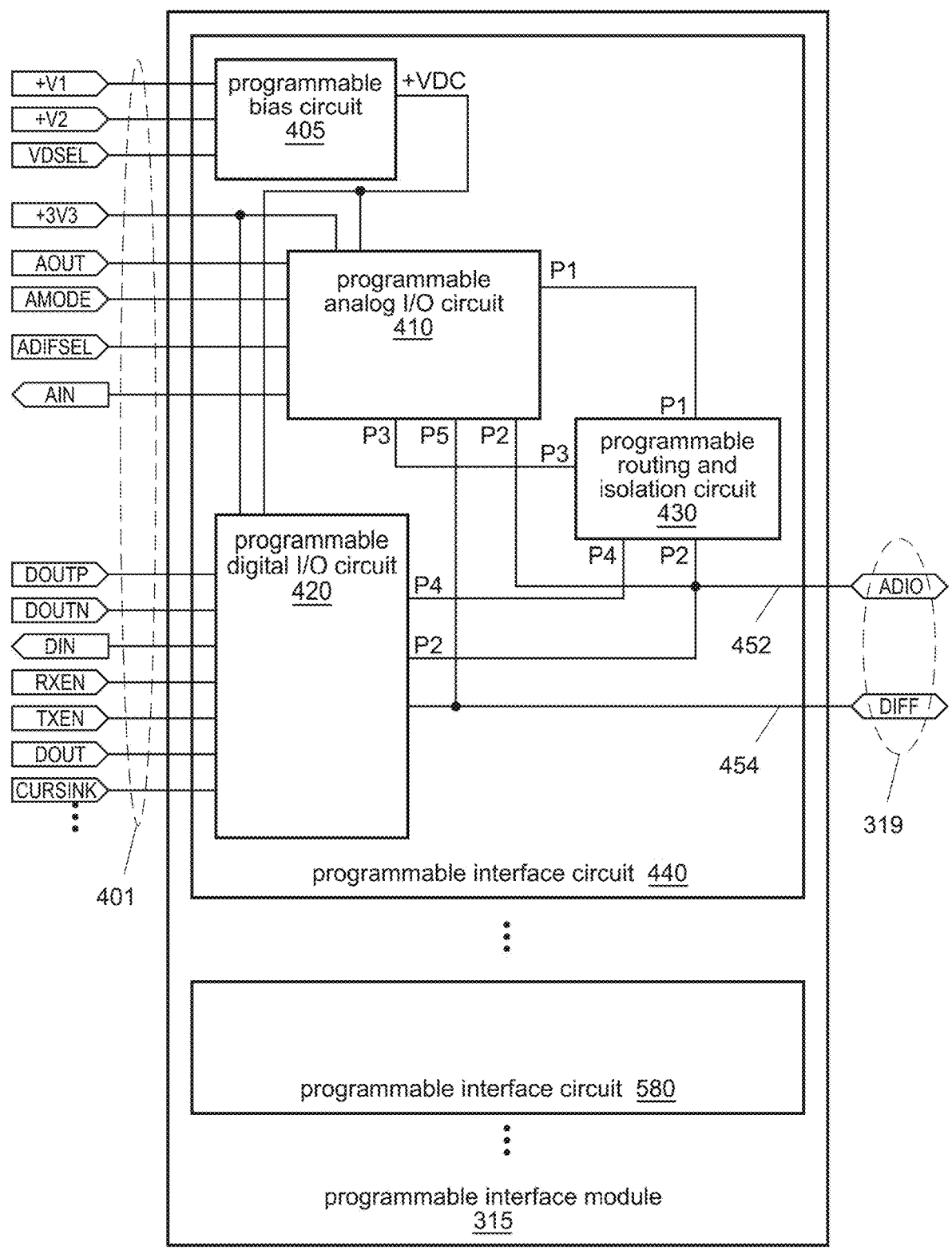
FIG. 4B depicts an example of the programmable interface module shown in FIG. 3, in which the module may include multiple programmable interface circuits, and in which each programmable interface circuit may include a programmable analog I/O circuit and a programmable digital I/O circuit, according to some inventive implementations.

In FIG. 4B, an example of a programmable interface module 315 is depicted with a simplified block diagram. A programmable interface module 315 can include a programmable bias circuit 405 that can be used to program the value of a supply voltage $+V_{DC}$ that is applied to one or more components in the programmable interface module 315. According to some implementations, a programmable interface module 315 can include one or more programmable interface circuits 440, 580 that each comprise programmable analog input/output circuitry 410 and programmable digital input/output circuitry 420. The analog I/O circuit 410 and digital I/O circuit 420 can receive signals from and transmit signals to an isolating communication controller 310 using at least some of the conductive interconnects 401. A programmable interface module 315 can further include programmable signal routing and isolation circuitry 430. Output signals produced by the analog I/O circuit 410 and digital I/O circuit 420 can be directed to one or two output conductive interconnects 452, 454 (labeled ADIO and DIFF, respectively) at a signaling port 317 with the signal routing and isolation circuitry 430, according to some implementations. In some cases, the signal routing and isolation circuitry 430 can be programmed such that one of the output interconnects (e.g., interconnect 452) provides single-ended signaling with respect to a ground potential or other reference potential. In some cases, the signal routing and isolation circuitry 430 can be programmed such that one of the output interconnects (e.g., interconnect 454) may provide a ground or fixed reference voltage or resistive path to ground for single-ended signaling on the other output interconnect. In some implementations, the signal routing and isolation circuitry 430 can be programmed such that the two output interconnects 452, 454 allow for differential signaling with respect to each other.

In some implementations, a programmable interface module 315 can include multiple copies of a single version of a programmable interface circuit 440 (e.g., copies of circuitry 410, 420, 430), where each programmable interface circuit may communicate with one or more machine components. In some implementations, there may be at least four copies of a programmable interface circuit 440 in a programmable interface module 315, such that the programmable interface module has four signaling channels (up to eight conductive interconnects 452, 545) to communicate with four machine components using an 8-wire cable 319. As such, standard industrial M8 or M12 cabling may be used to connect to the interface module 315. However, the inventive programmable interface module 315 is not limited to four copies of an interface circuit 440 and standard M8 or M12 cables. In some cases, a programmable interface module 315 may have fewer or more than four copies of the programmable interface circuit 440.

In some cases, there can be copies of two or more different versions of a programmable interface circuit 440, 580 within a programmable interface module 315. An example of such an implementation is described below in connection with FIG. 5E.

Figure 5A:
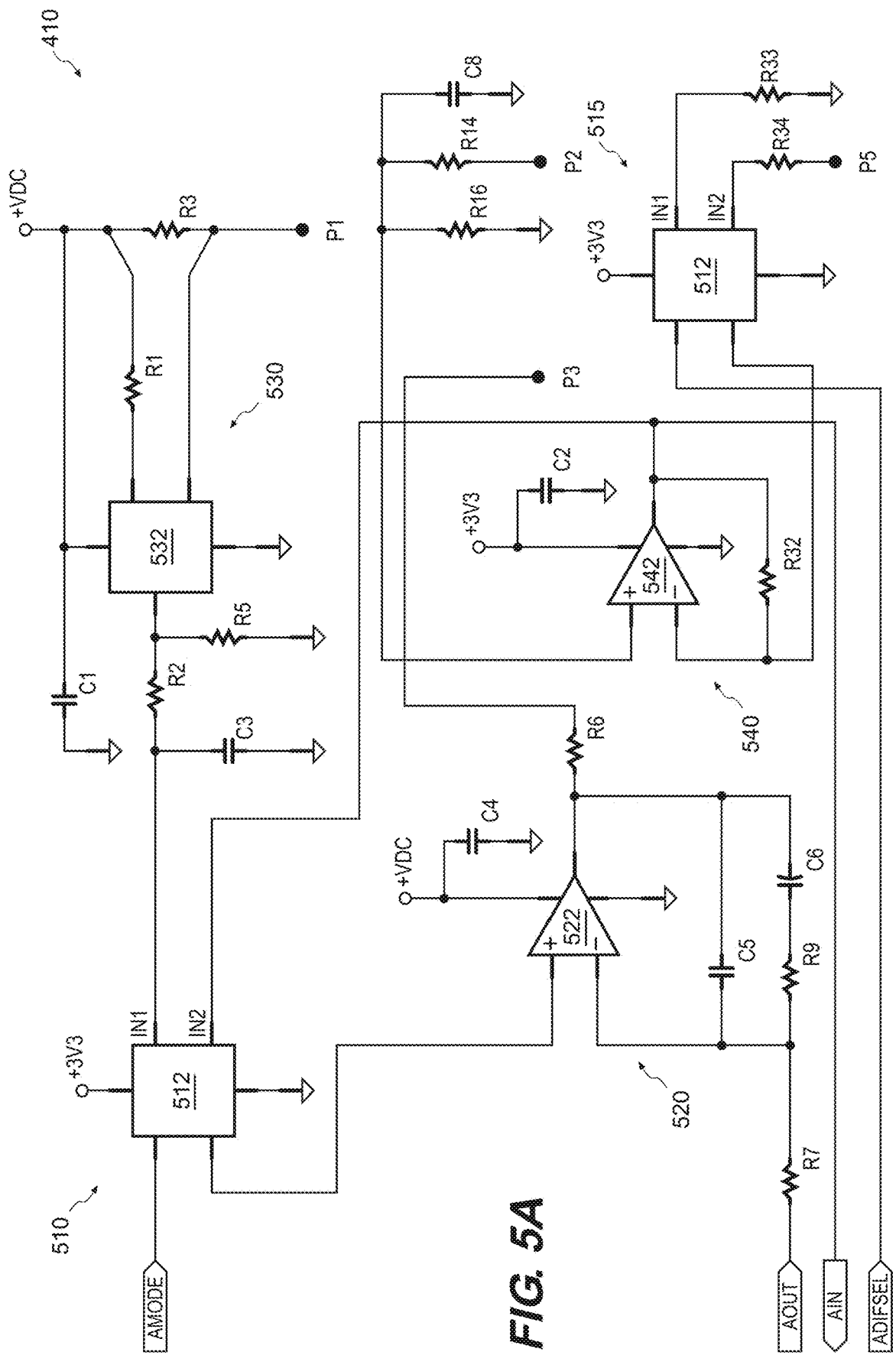
FIG. 5A illustrates an example of a programmable analog I/O circuit that may be used in the programmable interface module shown in FIG. 4B, according to some inventive implementations.

Further details of an example programmable analog I/O circuit 410 are illustrated in FIG. 5A. In some implementations, the programmable analog I/O circuit 410 comprises a first multiplexer 510, a second multiplexer 515, a switchable analog output signal driver 520, a current sensor 530, and a switchable receive signal driver 540. The first multiplexer 510, output signal driver 520, and current sensor 530 can be connected to form a programmable or switchable output signal driver that outputs signals that either encode signals in voltage levels (e.g., operates as a voltage source) or encodes signals in current levels (e.g., operates as a current source). Accordingly, the programmable analog I/O circuitry 410 can either output analog voltage-sourced signals or analog current-sourced signals. The receive signal driver 540 can be programmed to receive single-ended analog signals or differential analog signals.

In some implementations, the first multiplexer 510 may be embodied as a multiplexing chip 512 that can be programmed (through an interconnect AMODE) to select one of two input signals (IN1, IN2) to provide at an output of the multiplexing chip 512. An example of such a chip is the SN74LVC1G3157 single-pole double-throw analog switch configured for multiplexing operation, obtainable from Texas Instruments Incorporated of Dallas, Tex. However, other multiplexing circuits may be employed in some cases. For example, general-purpose field-effect transistors (FETs) may be used to controllably switch one of two signals onto a common output line. When a multiplexing chip 512 is used, the output from the chip can connect to a non-inverting terminal of an operational amplifier 522 in the output signal driver 520, for example. A programmable "select" input of the multiplexing chip (shown connected to the conductive interconnect labeled AMODE) can be used to program operation for an analog voltage mode (e.g., essentially voltage-sourced output) or analog current mode (e.g., essentially current-sourced output) of the programmable analog I/O circuitry 410. Voltage-sourced or current-sourced output can be provided to an interconnect P3 in the schematic of FIG. 5A, which can couple to circuitry with interconnect P3 (shown in FIG. 5C) to control voltage or current in the first output interconnect 452 (ADIO). In some implementations, the conductive interconnects in the drawings may be embodied as conductive traces or pads on a printed circuit board, wires, or pins of a connector, or some combination thereof.

A first input IN1 for the multiplexing chip 512 of the first multiplexer 510 can carry a signal that is proportional to a current level flowing in the first output interconnect 452 (ADIO). The current level can be sensed by a current sensor 530 having a current-sensing chip 532 that is arranged to sense current flow on a line connected between a voltage or current supply+$V_{DC}$ and the first output interconnect 452 (interconnects P1 in FIG. 5A and FIG. 5C connect in the circuit implementation). An example of a current-sensing chip 532 is the LT6106 current-sensing chip formerly marketed by Linear Technologies Corporation of Milpitas, Calif. and now available from Analog Devices of Norwood, Mass. However, other current-sensing circuits may be used (e.g., a sensing circuit that uses general-purpose operational amplifiers instead of a specialized chip). According to the illustrated implementation of FIG. 5A, a resistor R3 is placed in a power supply line that delivers power to the first output interconnect 452 through interconnect P1. A voltage difference across the resistor R3 can be sensed to provide a signal that is proportional to current flowing in the first output interconnect 452 (e.g., sourced to or sunk from the interconnect 452). A second input IN2 for the multiplexing chip 512 can carry a signal that is proportional to a voltage level at a first output interconnect 452 (ADIO) of the programmable interface circuit 440. For example, the second input IN2 may couple to the first output interconnect 452 (e.g., connect through one or more resistors R14 and receive signal driver 540) with the interconnect P2.

By selecting a signal from the first input IN1 or the second input IN2, either current-level sensing or voltage-level sensing can be provided in a feedback circuit path to a non-inverting terminal of the operational amplifier 522 in the analog output signal driver 520. Accordingly, the output signal driver 520 can be switched between two different feedback loops. When voltage-level sensing is used (IN2 input selected), the analog I/O portion of the programmable interface circuit 440 can operate in a voltage-to-voltage mode. In such a case, an output voltage from the amplifier 522 is proportional to an input voltage provided to the inverting terminal of the amplifier (e.g., through the conductive interconnect labeled AOUT. In some cases, an isolating communication controller 310 may supply an analog signal directly to AOUT (e.g., the isolating communication controller may include an on-board DAC). In other cases, a digital-to-analog converter (DAC) may be used (between the isolating communication controller and interface module as depicted in FIG. 4A or at a front end of the interface module 315) to convert a digital signal from the isolating communication controller 310 to an analog signal that is provided to AOUT.

When current-level sensing is used (IN1 input selected), the analog I/O portion of the programmable interface circuit 440 can operate in a current output mode. In such a configuration, an output current from the amplifier 522 is proportional to an input voltage provided to the inverting terminal of the amplifier through AOUT. The input voltage may be received from an isolating communication controller 310 or DAC as described above.

An additional feature of the programmable interface circuit 440 is that it can receive analog signals over at least the first output interconnect 452 (ADIO via interconnect P2) and provide the received analog signals to an isolating communication controller 310 (e.g., through an interconnect AIN) or to an analog-to-digital converter (ADC) that provides a corresponding digital signal to the controller 310, as illustrated in FIG. 4A. The switchable receive signal driver 540 can be used to monitor output signals delivered to the first output interconnect 452 (ADIO) for single-ended analog signals or to both output interconnects 452, 454 (ADIO and DIFF) for differential analog signals. For example, a second multiplexer 515 having a multiplexer chip 512 can be used to switch between inputs IN1 and IN2 that provide different configurations of the receive driver operational amplifier 542. When a first input (IN1) is selected based on a signal applied to interconnect (ADIFSEL), the inverting terminal of the operational amplifier 542 can connect to a reference potential (e.g., ground). In this configuration, the op-amp operates as a single-ended non-inverting amplifier for signals sensed via interconnect P2, which connects to the first output interconnect (ADIO). When a second input (IN2) is selected, the inverting terminal of the op-amp can connect to the second output interconnect 454 (DIFF). In this configuration, the op-amp 542 functions as a differential amplifier for differential analog signals appearing across the output interconnects (ADIO) and (DIFF). In some cases, the select pin of the second multiplexer 512 (illustrated connected to an interconnect labeled ADIFSEL) can instead connect to an interconnect (labeled RXEN) of a transceiver 570 (shown in FIG. 5B) to avoid an extra interconnect.

Output from the op-amp 542 of the switchable receive signal driver 540 can be provided to an interconnect (AIN) that provides the signal to an isolating communication controller (or to an ADC that provides the signal to an isolating communication controller, as depicted in FIG. 4A). When receiving or sensing an analog signal, the first output interconnect 452 may be isolated from the output of the operational amplifier 522 of the output signal driver 520 and from the digital I/O circuitry 420, as described in further detail below in connection with the programmable signal routing and isolation circuitry 430.

Figure 5B:
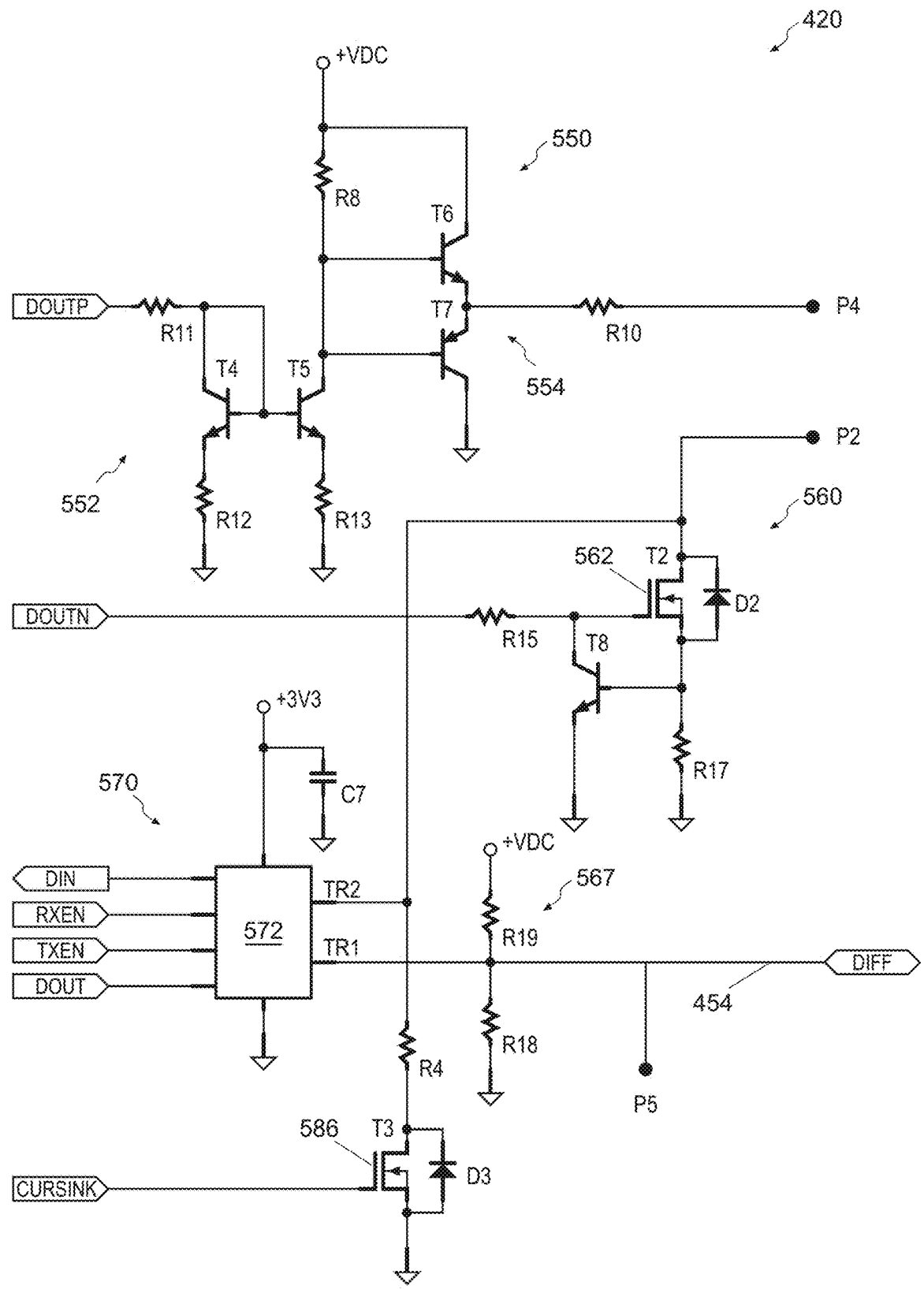
FIG. 5B illustrates an example of a programmable digital I/O circuit that may be used in the programmable interface module shown in FIG. 4B, according to some inventive implementations.

An example of programmable digital I/O circuitry 420 is illustrated in FIG. 5B. According to some implementations, the digital I/O circuitry 420 includes an adjustable high-level logic driver 550, a low-level logic driver 560, and a transceiver 570. The high-level logic driver 550 and low-level logic driver 560 can be used to provide single-ended logic signals on the first output interconnect 452 (ADIO). The transceiver 570 can be used to provide single-ended logic signals on the first output interconnect 452 or differential logic signals on the first output interconnect 452 (ADIO) and second output interconnect 454 (DIFF), and can also be used to receive single-ended and differential logic signals.

Because of the versatility of the analog and digital I/O circuitry, the programmable interface circuit 315 can support standardized network communications in some implementations. For example, one or more digital signaling channels can be programmed to support RS485 communications according to standard signaling protocols. As a more specific example, a digital I/O circuit 420 can be programmed to support a linear bus topology using two interconnects 452, 454 for a two-wire RS-485 networking channel. Alternatively, two digital I/O circuits 420 can be programmed to support a four-wire, full-duplex RS-485 networking channel. Other networking protocols that can be supported by a programmable interface module include, but are not limited to, Profibus and CAN bus.

According to some implementations, an adjustable high-level logic driver 550 can be implemented with a current mirror 552 and relay driver 554. The current mirror and relay driver can drive (via interconnect P4) a transistor 584 (shown in FIG. 5C) that switches any suitable voltage $+V_{DC}$ onto the first output interconnect 452. In this manner, the current mirror 552 and relay driver 554 can provide translation of a high logic value received from the isolating communication controller 310 (e.g., at the conductive interconnect labeled DOUTP) to any voltage level+$V_{DC}$ appropriate for a component of a machine 350 to interpret as a logic high level. The component can be connected to the first output interconnect 452. In some implementations, the voltage value+$V_{DC}$ can be user programmable, as described below in connection with FIG. 5D. Other implementations for the high-level logic driver 550 are possible. In some cases, an output from an isolating communication controller 310 may be sufficient to directly drive a transistor 584, and a current mirror 552 and relay driver 554 may not be needed. In some implementations, the current mirror and relay driver may be replaced with an amplifier, line driver, buffer, or some combination thereof.

A low-level logic driver 560 may be implemented in part with a transistor 562, according to some implementations. The transistor may be configured to switch a low-level reference voltage, such as ground potential, onto the first output interconnect 452 (through interconnect P2) in response to a signal received from an isolating communication controller 310 (e.g., via conductive interconnect DOUTN). In some cases, a resistor R17 and second transistor T8 may be used in combination with transistor 562 to establish a safe pull-down current to a voltage that will be interpreted as a logic low level by a component connected to the first output interconnect 452. In some cases, the low-level logic driver 560 can be used to invert a logic signal from the isolating communication controller. For example, transistor 562 may be an n-FET that is turned on by a positive voltage, and transistors 582 and 584 (FIG. 5C) may be placed in ON states. In such a configuration, a logic signal driving transistor 562 would be inverted at the first output interconnect 452. When the transistor 562 is placed in an OFF state, it can effectively isolate circuitry of the low-level logic driver 560 from the first output interconnect 452.

A transceiver 570 can be implemented with a transceiver chip 572 in some implementations. An example of a transceiver chip is the LTC2876 transceiver chip formerly marketed by Linear Technologies Corporation of Milpitas, Calif. and now available from Analog Devices of Norwood, Mass. Such a transceiver chip can provide user-selectable single-ended or differential digital transmission and reception on two output interconnects (TR1, TR2). In some cases, the transceiver chip 572 may be used for transmitting and receiving digital signals at 5 volt logic levels or at 3 volt logic levels. The logic signal level can be set, for example, by a voltage level applied to the transceiver's $V_{CC}$ supply pin. The transceiver 570 may have programmable input interconnects (labeled TXEN, RXEN) that can connect to an isolating communication controller 310 and be used to program the transceiver to transmit or receive digital signals, respectively. The transceiver 570 may further include digital data interconnects (labeled DIN, DOUT) that can connect to an isolating communication controller 310. The digital data interconnect DIN can be used to transmit digital data received from a component in a machine 350 to an isolating communication controller 310. The digital data interconnect DOUT can be used to transmit digital data received from the isolating communication controller 310 to a component in a machine 350. Although a specialized transceiver chip 572 may be used for some implementations, a transceiver 570 can be formed from more basic circuit components (such as packaged transistors, resistors, etc.) in alternative implementations.

The digital I/O circuitry 420 may include a shunting switch (e.g., transistor 586), according to some implementations, that connects between the first output interconnect 452 (via interconnect P2) and a reference voltage (ground in the illustrated example). In some cases, a low-impedance resistor R4 may be included in series with the current-carrying terminals of the transistor 586. This transistor may be used to provide a logic low-level value on the first output interconnect. It may also be used to provide a low-impedance sink for current received from the first output interconnect 452 (e.g., when receiving analog signals from sensors). For example, the value of the resistor R4 may be any value between 10 ohms and 500 ohms. The low-impedance path may be useful for current-sensing or current-encoded communication operations and for differential analog voltage measurements.

In some implementations, digital I/O circuitry 420 may further include a second shunting switch (e.g., a transistor, not shown) that connects between the second output interconnect 454 (DIFF) and a reference voltage (e.g., ground). This second shunting switch may be used to provide a reference voltage on the second output interconnect 454 for single-ended transmission or reception, for example. Digital I/O circuitry 420 can include interconnects P2, P4, and P5 that connect with corresponding interconnects of the Analog I/O circuitry 410.

Figure 5C:
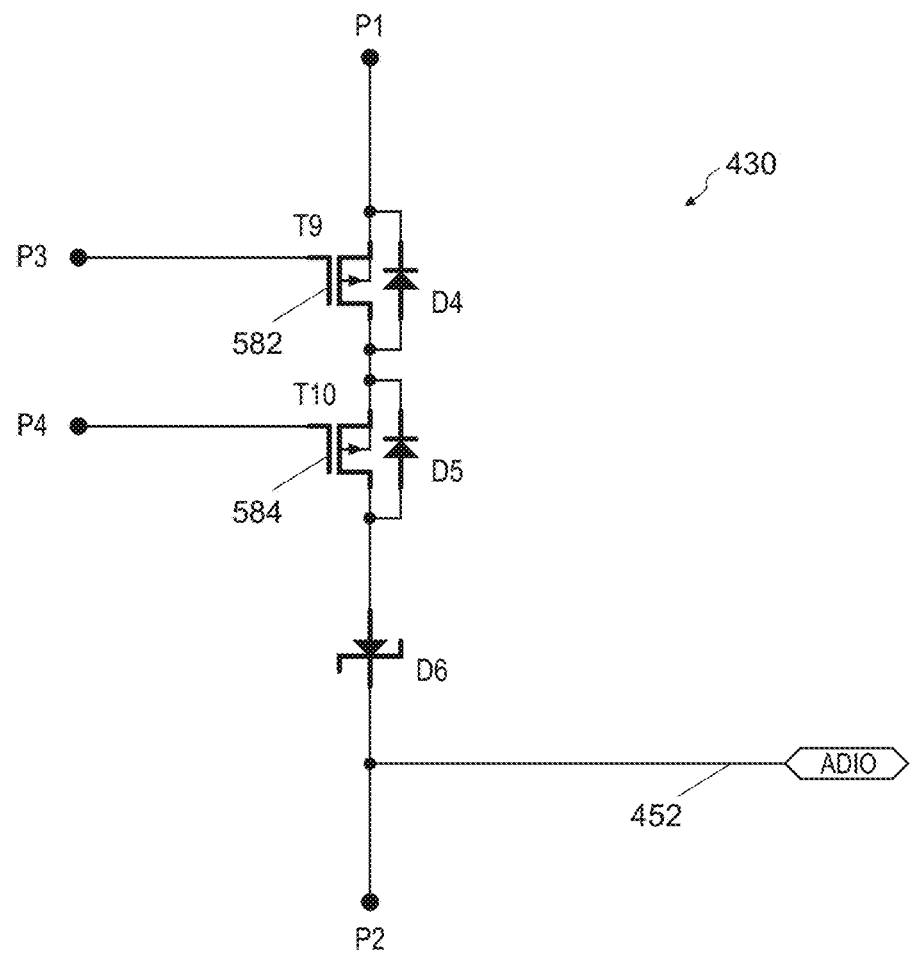
FIG. 5C illustrates an example of a programmable signal routing and isolation circuit that may be used in the programmable interface module shown in FIG. 4B, according to some inventive implementations.

FIG. 5C illustrates an example of programmable signal routing and isolation circuitry 430 that can be implemented in a programmable interface circuit 440. According to some implementations, the routing and isolation circuitry comprises a plurality of transistors that are configured to switch analog or digital signals onto the first output interconnect 452 (ADIO) and/or isolate analog and digital circuitry from the first output interconnect 452. For example, a first transistor 582 can be configured as an amplifier that drives an analog signal on the first output interconnect 452 when an analog signal is input to the analog I/O circuitry 410 (e.g., received from an isolating communication controller 310 at interconnect AOUT and output to interconnect P3 by the analog signal driver 520 of FIG. 5A). The first transistor 582 may be a power FET, such as the Siliconix Si3459BDV power MOSFET available from Vishay Intertechnology, Inc. of Malvern, Pa. When digital signals are provided to the first output interconnect 452, the first transistor 582 may be placed in an ON state, so that a voltage supply can be provided to a second transistor 584 of the routing and isolation circuitry 430.

The second transistor 584 (which can also be a power transistor and may be a same model as the first transistor 582) may be used to drive logic signals on the first output interconnect 452. For example, a logic signal applied to the input of the high-level logic driver 550 (e.g., provided at interconnect DOUTP of FIG. 5B) can be translated in voltage and switched onto the first output interconnect 452 by the second transistor 584.

When signaling is not provided by the analog I/O circuitry 410 nor the high-level logic driver 550, the first transistor 582 and second transistor 584 may be placed in an ON state to supply a high voltage level $+V_{DC}$ to the first output interconnect 452. In this configuration, the digital signal interconnect DOUTN and low-level logic driver 560 can be used to drive an inverted logic signal on the first output interconnect 452, according to some implementations.

The transistors of the programmable signal routing and isolation circuitry 430 and the transistor 562 of the low-level logic driver 560 may, in some cases, be thought of as isolation switches. For example, when a relevant one of these transistors is in an OFF state, it can isolate the first output interconnect from analog circuitry, digital circuitry, and/or voltage levels associated with the analog and digital circuitry. Use of these transistors allows the flexible I/O signaling (transmission and reception) of different types of digital and analog signals through a same signaling channel having one or two output interconnects 452 (ADIO), 454 (DIFF), according to some implementations.

Figure 5D:
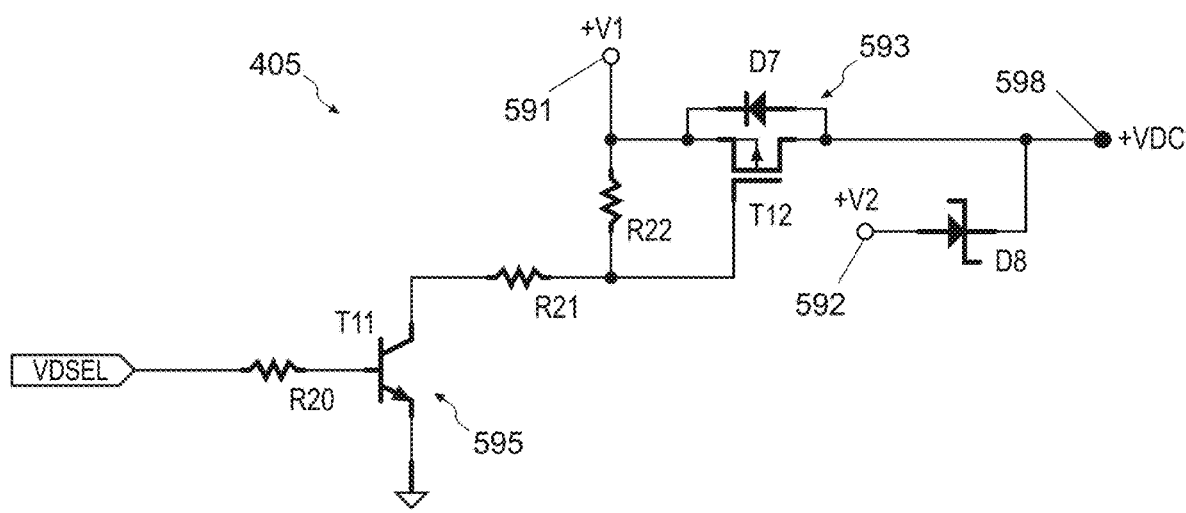
FIG. 5D illustrates an example of a programmable bias circuit that can be used to program voltage supply levels in the programmable interface module shown in FIG. 4B, according to some inventive implementations.

As described above, voltage supplies that may be used in a programmable interface circuit 440 (such as $+V_{DC}$ and $-V_{DC}$ for a circuit that provides positive and negative voltage swings) can be user-programmed according to some implementations. FIG. 5D illustrates an example programmable bias circuit 405 for programming a supply voltage for any one or combination of the circuit portions described above. According to some implementations, a programmable bias circuit 405 can include a first terminal 591 configured to receive a first bias voltage (+24 V in the illustrated example) and a second terminal 592 configured to receive a second bias voltage (+5 V in the illustrated example) that are connectable to an output bias terminal 598 providing a bias voltage $+V_{DC}$. Other bias values may be used for other implementations. A first transistor 593 may be used to connect the first terminal, having a higher bias value, to the output bias terminal 598. A Zener diode D8 may be used to effectively isolate a lower bias supply from the output bias terminal when the higher bias supply is connected to the output terminal. In some cases, a second transistor 595 may be used to turn the first transistor 593 on or off (e.g., if a gate voltage needed for the first transistor is higher than that provided by a logic driver of an isolating communication controller). A bias value may be selected by setting or clearing a logic input (labeled VDSEL). Although only two bias values are shown that are selectable by a single programmable logic input, additional bias values may be added and selected by adding more transistors, bias input terminals, and programmable logic inputs, for example.

Some example voltage bias values that may be used to operate a programmable interface module 315 and its interface circuits 440 include, but are not limited to, 24 V DC, 5 V DC, and 3.3 V DC. In some implementations, a programmable interface module 315 may include power supply circuitry and/or components to generate the bias voltages internally and in isolation from an isolating communication controller. In such implementations, a programmable interface module 315 may locally share the ground reference(s) of the component(s) connected to the interface module via a wire on interconnect cables 319, 314 in a local portion of the machine, and avoid ground discrepancies that could occur over larger portions of the machine. In some cases, a programmable interface module 315 may also or alternatively share one or more bias supplies locally with the component(s) connected to the interface module via one or more wires on an interconnect cable in a local portion of the machine.

Referring again to FIG. 4B, it will be appreciated from the above descriptions of the programmable analog I/O circuitry 410, programmable digital I/O circuitry 420, and programmable signal routing and isolation circuitry 430 that various settings on the interconnects 401 can configure or program an interface circuit 440 to handle different types of analog and digital signaling. Some example settings are described next. It will be appreciated by one knowledgeable in the art that the described settings are dependent upon the types and/or number of transistors used to implement isolation switches in the interface circuit 440. Accordingly, the settings may differ when different types and/or different numbers of transistors are used to implement isolation switches.

For analog signal transmission to a component of a machine 350, the second transistor 584 can be placed in an ON (i.e., conducting) state (e.g., DOUTP set to a logic high value) which allows an analog signal to pass through to the first output interconnect 452, the shunting transistor 586 can be placed in an OFF (i.e., non-conducting) state (interconnect CURSINK cleared to a logic low value) which isolates the reference potential (ground in the illustrated implementation) from the first output interconnect 452, and the transistor 562 of the low-level logic driver 560 can be placed in an OFF state (DOUTN cleared to a logic low value) which isolates the low-level logic driver circuitry from the first output interconnect 452. It will be appreciated that analog signal transmission may be in current mode or voltage mode, in accordance with a mode selection (made on interconnect AMODE) as described above. Further, analog data may be transmitted as time-varying signals, as static DC values, or as time-varying signals superposed on a DC value (e.g., serial data superposed on a DC current) by application of such signals to interconnect AOUT by an isolating communication controller 310.

For analog signal reception, at least the second transistor 584 can be placed in an OFF state (DOUTP cleared to a low logic value) to isolate circuitry of the high-level logic driver 550, the amplifier 520, the current sensor 530, and supply+$V_{DC}$ from the first output interconnect 452. In some cases, the first transistor 582 may also be placed in an OFF state (AOUT cleared to a low or zero-voltage level). The transistor 562 of the low-level logic driver 560 can be placed in an OFF state for analog signal reception. In some cases, the shunting transistor 586 can be placed in an ON state (CURSINK set to a logic high value) to sink analog current for analog signal reception based on received current. Alternatively, the third transistor 586 can be placed in an OFF state (CURSINK set to a logic low value) for analog signal reception based on received voltage. Further, analog data may be received as time-varying signals, temporarily static values, or as time-varying signals superposed on a temporarily static value. A temporarily static value may have no change in value for a period of time between 1 microsecond and 10 seconds.

When a time-varying signal is superposed on a temporarily static value, appropriate digital filtering by an isolating communication controller for analog signal reception can allow the DC current or voltage information to be read while also reading serial digital information superposed on the DC current or voltage. The serial digital information may be superposed for signal transmission and/or reception, according to some implementations, as a +/−1 mA modulation of a DC current in the range of 4 to 20 mA. Baud rates of the superposed data between 300 baud and 230.4 kilobaud, as well as higher rates may be received and decoded by an isolating communication controller or component of a machine, according to some implementations.

When a transceiver chip 572, such as the LTC2876 transceiver chip, is used in the transceiver 570, it may be desirable to place its outputs in a high-impedance state during analog signal transmission and reception. For the LTC2876 transceiver chip, this can be done by placing the chip's receive enable pin (connected to interconnect RXEN in the illustrated implementation) at a high logic level and placing the chip's transmission enable pin (connected to interconnect TXEN in the illustration) at a low logic level. Other settings may be needed for different transceiver chips or transceiver configurations.

For differential signal transmission and reception via the transceiver 570, at least the second transistor 584 can be placed in an OFF state (DOUTP cleared to a logic low value) to isolate circuitry of the high-level logic driver 550, the amplifier 520, the current sensor 530, and supply+$V_{DC}$ from the first output interconnect 452 (ADIO). In some cases, the first transistor 582 may also be placed in an OFF state (AOUT cleared to a low or zero-voltage level). The transistor 562 of the low-level logic driver 560 can also be placed in an OFF state (DOUTN cleared to a low logic value) for differential signal transmission. The shunting transistor 586 can also be placed in an OFF state (CURSINK cleared to a logic low value) to isolate the reference potential (ground in the example) from the differential signal lines (ADIO and DIFF).

Transmission mode and reception mode for differential digital signaling may be established by setting pin values on a transceiver chip 572. For example, when the LTC2876 transceiver chip is used in the transceiver, clearing its receive enable pin (connected to RXEN) to a logic low value and clearing its transmit enable pin (connected to TXEN) to a logic low value configures the transceiver to receive differential digital signals on the first output interconnect 452 (ADIO) and second output interconnect 454 (DIFF) and provide a corresponding digital signal to an isolating communication controller 310 at the chip's digital output (connected to interconnect DIN). Conversely, setting the transceiver chip's receive enable pin to a logic high value and setting its transmit enable pin to a logic high value configures the transceiver to transmit a digital signal received at the chip's digital input (connected to interconnect DOUT) from an isolating communication controller 310 to a component connected to the first output interconnect 452 (ADIO) and second output interconnect 454 (DIFF) as a differential digital signal. Other settings may be needed for different transceiver configurations.

Single-ended digital reception may be performed with the transceiver 570 according to some implementations. For example, when the LTC2876 transceiver chip is used in the transceiver, clearing its receive enable pin (connected to RXEN) to a logic low value and clearing its transmit enable pin (connected to TXEN) to a logic low value configures the transceiver to receive single-ended digital signals on the first output interconnect 452 (ADIO). The second transistor 584, the third transistor 586, and optionally the first transistor 582 may also be cleared to isolate their respective circuitry. In this configuration, a logic high value will appear on the transceiver's output (connected to DIN) when a voltage level on the first output interconnect 452 (ADIO) is greater than one-half the value of +$V_{DC}$ (due to the voltage divider 567 on the second output interconnect 454 in the illustrated implementation). A logic low value will appear on the transceiver's output (DIN) when a voltage level on the first output interconnect 452 (ADIO) is below one-half the value of +$V_{DC}$. If current pull-up is required when receiving single-ended digital signals from some transmitters, the first transistor 582 and second transistor may be set to an ON state. If current pull-down is required when receiving single-ended digital signals from some transmitters, the transistor 562 of the low-level digital driver 560 may be set to an ON state.

Single-ended digital transmission can be performed with the high-level logic driver 550 and/or low-level logic driver 560, as described above. Settings for the interconnects to enable single-ended digital transmission will be apparent to one knowledgeable in the art based on the foregoing description. When performing single-ended digital transmission, the outputs of the transceiver 570 may be placed in a high-impedance state, as described above. By selecting a voltage level for +$V_{DC}$, single-ended digital transmission can be performed at a user-programmed, logic-high voltage level.

If needed, one or more of the interconnects 401 between an isolating communication controller 310 and the programmable interface module 315 can be electrically isolated to an extent from outputs and/or other portions of the isolating communication controller. For example, opto-isolation, capacitive isolation, or inductive isolation circuits, or some combination thereof, may be used to provide an extent of electrical isolation (e.g., to isolate from unwanted DC voltages, DC currents, and/or prevent signal cross-talk).

Figure 5E:
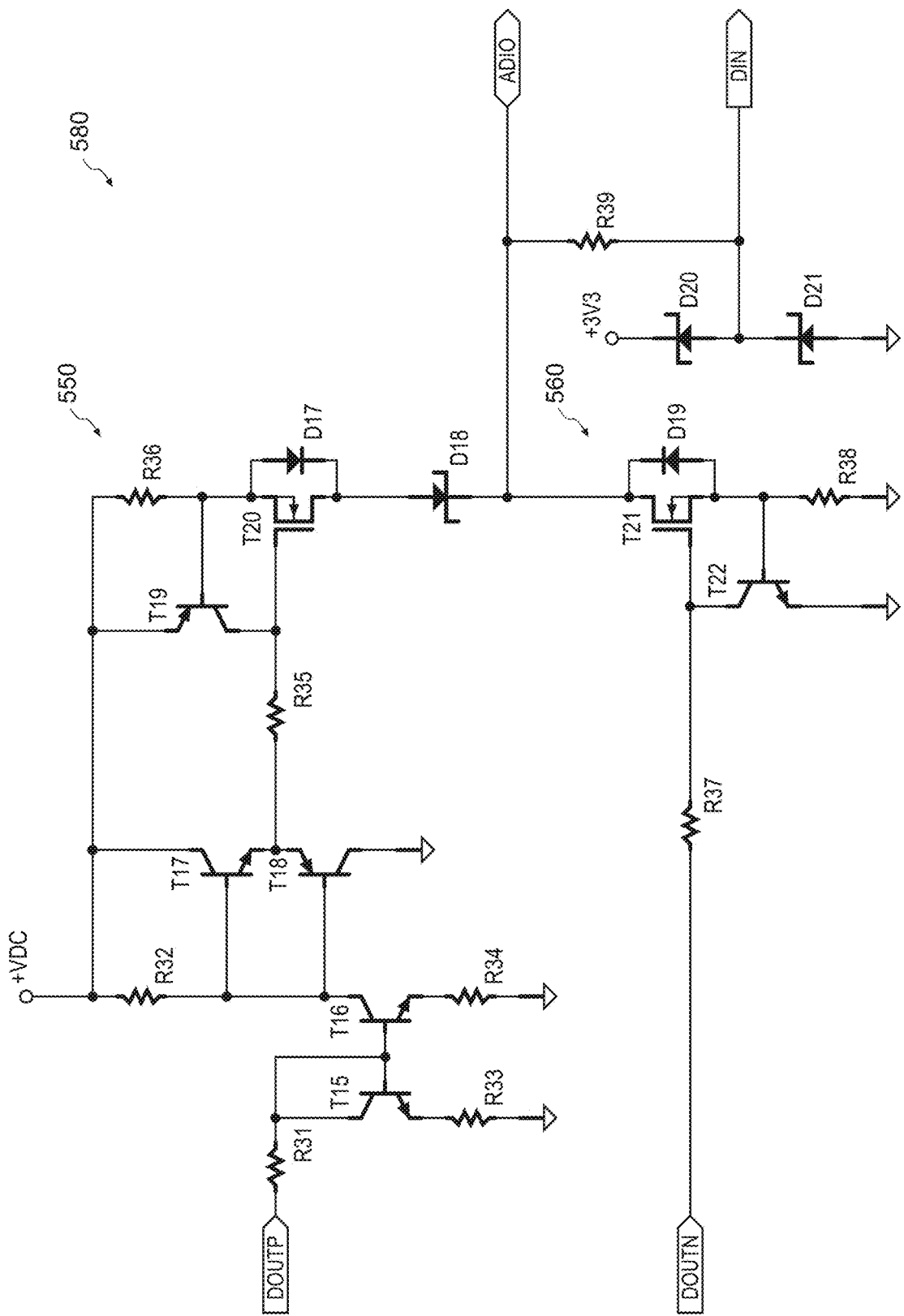
FIG. 5E illustrates another example of a programmable digital I/O circuit that may be used in the programmable interface module shown in FIG. 4B, according to some inventive implementations.

In some implementations, two variations of the digital I/O circuitry may be used in an interface module 315. FIG. 5E depicts a variation of the digital I/O circuitry shown in FIG. 5B. The digital I/O circuitry 580 of FIG. 5E includes the high-level logic driver 550 and low-level logic driver 560, but does not include a transceiver chip 572. Instead, the digital I/O circuitry 580 uses a pair of Zener diodes D20, D21 to clamp received voltages to about 3 volts. The pair of diodes provides a robust means of translating single-ended digital signals, received from a very wide range of signaling voltages output by a component's transmitter, to a suitable digital input signal level for an isolating communication controller 310. For the example shown, the received single-ended digital signal can be reduced to approximately 3 volts. By providing a different supply voltage on the Zener diode pair, the received single-ended digital signal can be reduced to other digital voltage values (e.g., 5 volts, 1.8 volts, 1.5 volts, etc.).

The digital I/O circuitry 580 of FIG. 5E may be used for single-ended digital transmission and reception (e.g., when differential digital signaling is not needed). The digital I/O circuitry 580 may be used in tandem with the analog I/O circuitry 410 described above in some interface circuits 440 of a programmable interface module 315.

Alternative circuits may be used for portions of the programmable interface module 315, in some implementations. Such alternative circuits are described in U.S. provisional application No. 62/931,188, filed on Nov. 5, 2019, titled "Input/Output Methods and Apparatus for Monitoring and/or Controlling Dynamic Environments," in connection with FIG. 4A, FIG. 4B, and FIG. 5 found in that application. Examples of alternative circuits to implement analog I/O signaling instead of the analog circuit of FIG. 5A are shown in FIG. 6A and FIG. 6B.

Figure 6A:
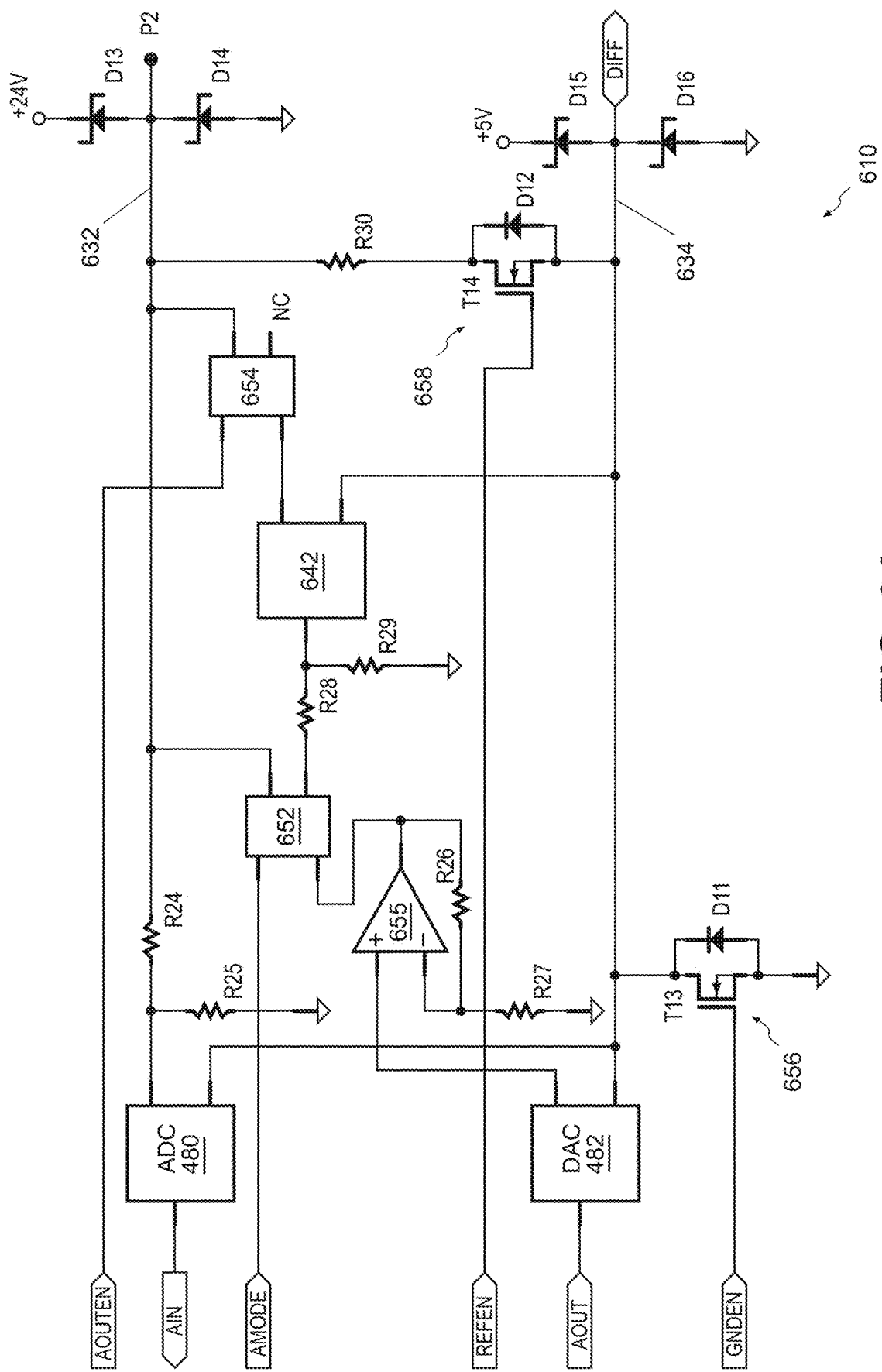
FIG. 6A illustrates an example of an alternative circuit to implement programmable analog I/O signaling in the programmable interface module shown in FIG. 4B, according to some inventive implementations.
Figure 6B:
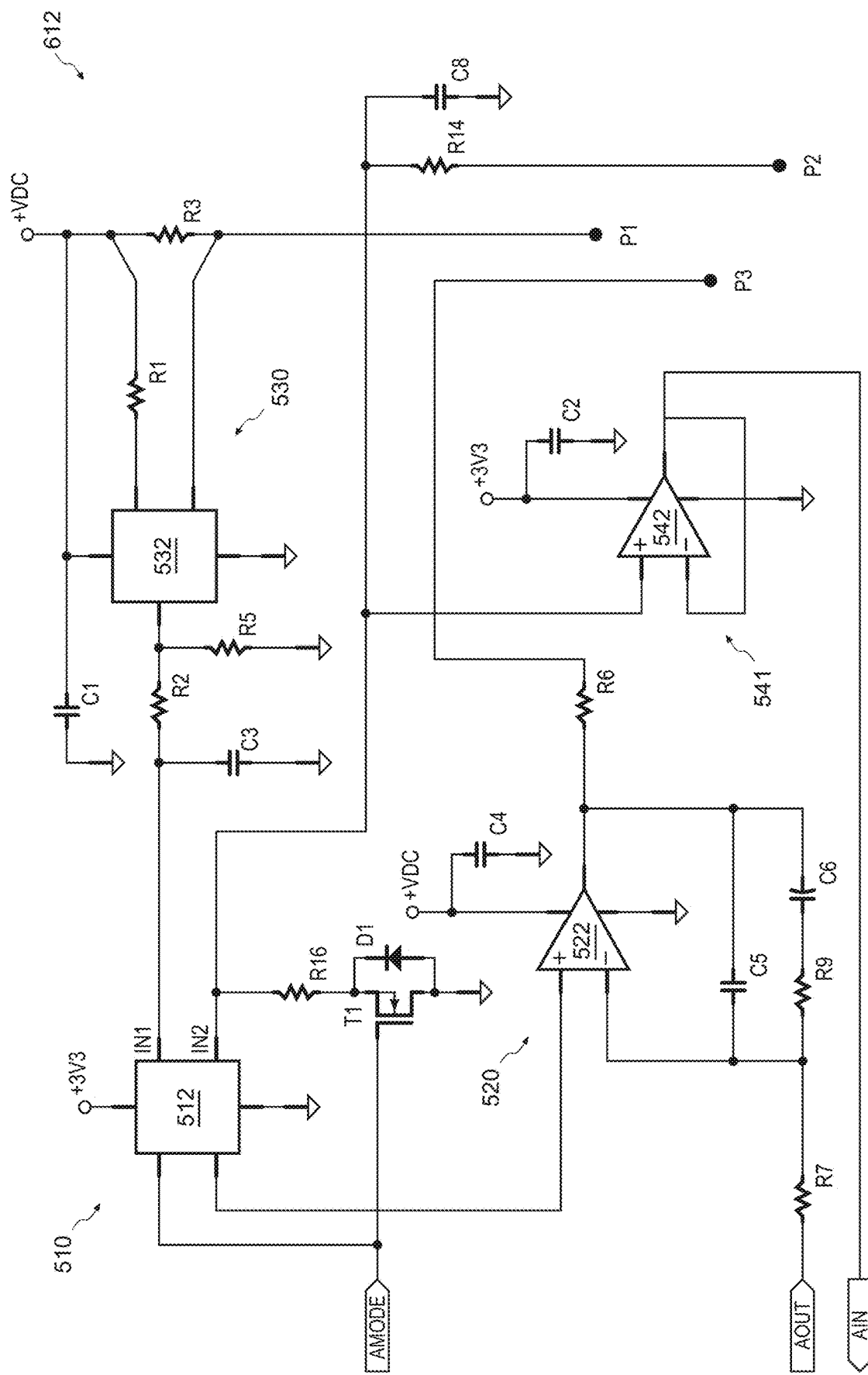
FIG. 6B illustrates an example of an alternative circuit to implement programmable analog I/O signaling in the programmable interface module shown in FIG. 4B, according to some inventive implementations.

FIG. 6A illustrates an example of an alternative programmable analog I/O circuit 610 that may be used to transmit and receive analog signals between an isolating communication controller 310 and a component 320, 325, 330, 340, according to some implementations. The analog I/O circuit 610 may comprise a voltage-to-current converter 642 and a plurality of switches 652, 654, 656, 658 (which may be implemented, at least in part, with transistors). In some implementations, the analog I/O circuit 610 may be combined with one or both of an analog-to-digital converter 480 and a digital-to-analog converter 482. When an isolating communication controller 310 is capable of outputting and receiving analog signals, then the analog-to-digital converter 480 and a digital-to-analog converter 482 may not be used. According to some implementations, an analog I/O circuit 610 may include Zener diode voltage limiters on its two output interconnects 652, 654 (AN1, AN2) that can limit an amount of voltage appearing on each line (e.g., 24 V and 5 V in the illustrated example). An analog I/O circuit 610 may further include resistors and capacitors for filtering, voltage adjustment, current adjustment, and/or current limiting.

When a circuit in accordance with FIG. 6A is used in a programmable interface circuit 440, it may replace the programmable analog I/O circuit 410 of FIG. 5A. For example, the first multiplexer 510, second multiplexer 515, analog output signal driver 520, and current sensor 530 may be removed and replaced with the circuitry of FIG. 6A. The receive signal driver 540 may be removed or changed to a non-switchable voltage follower or amplifier. Further, the first transistor 582 of the programmable signal routing and isolation circuitry 430 may be removed. A current-limiting resistor may be retained between the second transistor 584 and voltage supply +$V_{DC}$. The programmable analog I/O circuit 610 of FIG. 6A can operate in tandem with the programmable digital I/O circuit 420 of FIG. 5B. For example, a first output interconnect 632 (P2) of the alternative programmable analog I/O circuit 610 may connect to the first output interconnect 452 (ADIO) of the programmable interface circuit 440 and the second output interconnect 634 (DIFF) of the programmable analog I/O circuit 610 may connect to the second output interconnect 454 (DIFF) of the programmable interface circuit 440.

In further detail, the voltage-to-current converter 642 may receive an analog voltage signal and output an analog current signal having current values that are proportional to and representative of the analog voltage signal. The current converter 642 may drive signals in a current loop with a component of the machine, and output current levels from 4 mA to 20 mA in some cases, or between approximately those values. In some implementations, current converter 642 may output current levels for signaling from 0.2 milliamps (mA) up to 25 mA, or between approximately those values. An example current converter is the XTR117 current-loop transmitter available from Texas Instruments Incorporated of Dallas, Tex. The current converter 642 may be arranged with switches 652, 654 that can isolate the voltage-to-current converter 642 from the outputs and from the digital I/O circuitry 610 when placed in an OFF state (i.e., open-circuit or high-impedance state), or allow it to receive an analog signal originating from the isolating communication controller 310 and output an analog current signal onto the first output interconnect 632 (P2).

According to some implementations, the first switch 652 can be a double-throw switch. In a first position (set or cleared by a signal on interconnect AMODE), it can connect an interconnect carrying a digital output (DAOUT) from the isolating communication controller that is converted to an analog signal to an input of the voltage-to-current converter 642. In a second position, it can connect the first output interconnect 632 (P2) to the input of the voltage-to-current converter 642 for transmission of a signal received via P2 to a component of a machine 350.

A third switch 656 can be used to provide a current path (such as a low-impedance path via resistor R30) to ground, for example, when receiving analog signals from a component, or to provide a reference voltage (e.g., ground) when transmitting analog signals to a component. The third switch can be programmed, for example, by a programming input placed on an interconnect (labeled GNDEN). A fourth switch 658 also can be used to provide a current path to ground when receiving analog signals from a component. A programming input may be implemented as, but not limited to, a programming voltage signal, a programming current signal, or a programming optical signal.

The settings of the four switches 652, 654, 656, 658 for various types of analog signal transmission and reception will be evident based upon the foregoing description to those knowledgeable in the field of digital and analog electronics. For digital signal transmission and reception, the first switch 652, second switch 654, and fourth switch 658 may be placed in an OFF (open-circuit or high-impedance) state. For differential digital transmission and reception, the third switch 656 may be placed in an OFF state. For single-ended digital transmission and reception and single-ended analog transmission, the third switch 656 may be placed in an ON (short-circuit or low-impedance) state. The four switches 652, 654, 656, 658 can be programmed by programming inputs placed on interconnects (labeled AMODE, AOUTEN, GNDEN, and REFEN, respectively) connected to the switches.

FIG. 6B depicts another possible implementation of a programmable analog I/O circuit 612. The implementation of FIG. 6B is like that of FIG. 5A except the receive signal driver 541 is not switchable. Instead, the receive signal driver 541 has an operational amplifier 542 that is configured as a follower. The operational amplifier 542 in the receive signal drivers 540, 541 can accommodate signals from a range of output impedances. For the implementation of FIG. 6B, the second input of the multiplexer 512 connects to the output interconnect P2 through a resistive path (R14) and connects to a shunting resistive branch (R16 and T1) that can provide a path to ground for current when T1 conducts. The circuit of FIG. 6B has one less chip than the circuit of FIG. 5A and may be used when differential analog signal reception is not needed.

Although the above-described circuits are described primarily for positive power supplies (e.g., positive potential to ground), the circuits can be readily adapted by those skilled in the art of electronics based on the above descriptions for operating at negative voltages or operating over a range of positive and negative voltages. Though a majority of information signaling involves positive potentials in many applications, some analog signals (e.g., from sensors) may comprise negative voltages. In such cases, level shifting of a signal may be used, or a negative potential power supply may be added to the analog I/O circuitry (e.g., to power the analog output signal driver 520 and/or the receive signal driver 540), so that signals ranging from positive to negative voltage values can be received and transmitted. In such cases, the programmable signal routing and isolation circuitry 430 may be modified to handle positive and negative voltage swings.

A programmable interface module 315 constructed from the above-described programmable interface circuits 440 can have two output interconnects 452, 454 (ADIO, DIFF) for each interface circuit 440, according to some implementations. In some cases, four interface circuits 440 can be included in an interface module 315. As such, there can be 8 output interconnects from the interface module that could be used to interface with four components of a machine. In such a case, an 8-wire or 10-wire ethernet cable with connectors described above may be used to connect the interface module 315 to a break-out box 318 located near the components, as illustrated in FIG. 3. The break-out box 318 may receive the ethernet cable and run separate wires or cables 14 to each component. In other implementations, there can be more or fewer interface circuits 440 in an interface module 315, and different cables and connectors may be used as appropriate.

In some implementations, it may be desirable to provide power (e.g., $+V_{DC1}$, $+V_{DC2}$, $-V_{DC1}$, etc.) and/or a reference potential (e.g., ground) over an interconnect cable. In some such cases, cables and connectors with additional wires and pins may be used (e.g., 10-wire instead of 8-wire). In other such cases, some of the interface circuit's 440 second output interconnects 454 may not be used and/or tied to the reference potential. For example, one or more of the second output interconnects 454 may be grounded if it is known that they will be used only for single-ended signaling. Alternatively, if single-ended digital I/O circuits 580 of FIG. 5E are used, a second output interconnect 454 (DIFF) is not present, which can free up one or more wires of an 8-wire ethernet cable to carry power ($+V_{DC}$) and/or a reference potential (ground).

The number of interface circuits 440 that are used in a programmable interface module 315 will determine, at least in part, a number of wires and pins needed for cable and connector interconnects. The pin assignment connectors may be arranged in any suitable manner. For example, an interface module 315 having only four programmable interface circuits 440 may use an 8-pin connector and standard 8-wire ethernet cable. When a voltage supply and reference voltage are provided over the cable, a pin configuration may be as shown in Table 1. In this example, two of the interface circuits 440 may include the single-ended digital I/O circuits 580 of FIG. 5E whereas two include the digital I/O circuitry 420 of FIG. 5B. Alternative pin assignments can be used in other implementations. In some implementations, the pin assignments may be standardized and recognized as an industrial standard.

TABLE 1

Example pin assignment for an 8-wire ethernet cable.

| Pin Number | Signal |
|---|---|
| 1 | ADIO_1 |
| 2 | ADIO_2 |
| 3 | ADIO_3 |
| 4 | ADIO_4 |
| 5 | $+V_{DC}$ |
| 6 | DIFF_1 |
| 7 | GND |
| 8 | DIFF_2 |

The disclosed circuits described above can translate isolated digital signals to and from high-speed, networked, isolating communication controllers 310 into the currents and voltages necessary to send and/or receive signals to and/or from peripheral devices which may implement a wide variety of signaling schemes (e.g., single-ended, differential, current mode, voltage mode, digital, and analog) at popular or custom voltage and current ranges. Signaling type and voltage or current levels can be user-selected and programmed over interconnects 401 via the isolating communication controllers 310. Programmability may be implemented in hardware (e.g., as user-settable switches) according to some implementations, or in software according to some implementations, or in a combination of hardware and software settings. Software programmability may be implemented as a pull-down menu providing selections of signaling type, data direction, voltage levels, current levels, etc. on a per-channel basis. The software may be part of system operating software for a central controller 301 and one or more isolating communication controllers 310 that are in communication with the central controller.

In some implementations, the disclosed circuits may be packaged in compact IP67 or similar ruggedized cases that can be distributed throughout a machine. In some implementations, less ruggedized cases may be usable. A packaged case may include an isolating communication controller 310 and a programmable interface module 315, according to some implementations. In other implementations, a packaged case may include only a programmable interface module 315. By distributing such packaged cases throughout a machine, custom wiring harnesses, long cables, and electrical cabinets for machine controls may be significantly reduced or eliminated. For example, the number of ethernet cables (such as waterproof, industry standard ethernet cables) used to interconnect a machine may be reduced by more than a factor of 16 using isolating communication controllers 310 and programmable interface modules 315 of the present implementations, as compared to conventional interconnect approaches for complex automated or semi-automated machines.

Figure 7:
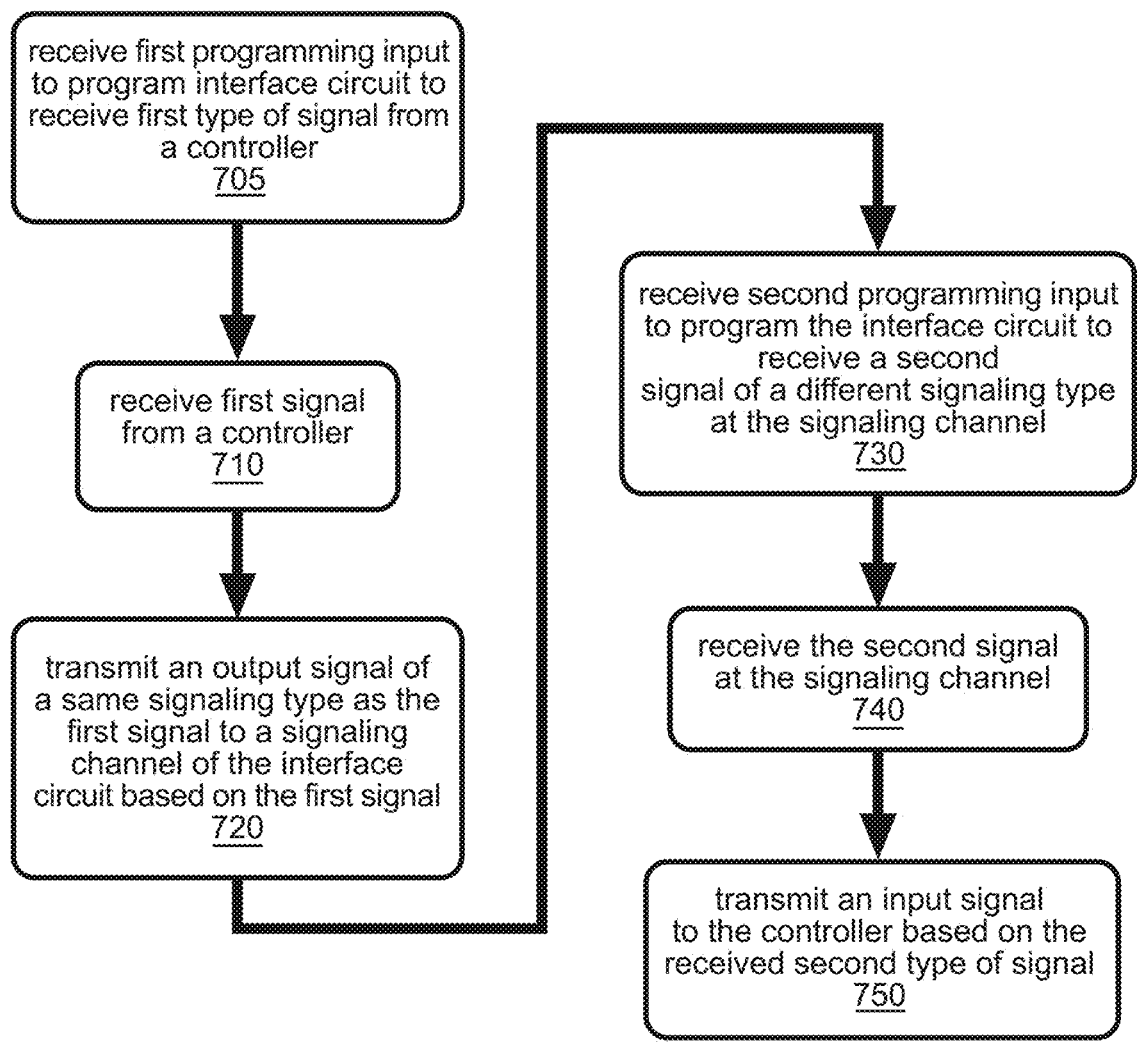
FIG. 7 depicts acts associated with methods for automated or semi-automated control of a machine, according to some inventive implementations.

Various methods of operating components of a machine 350 using a programmable interface module 315 of the present implementations are possible. Acts associated with an example method 700 are shown in the flow chart of FIG. 7. An example method 700 for signaling between a controller (such as an isolating communication controller) and one or more components of a machine can include receiving a programming input at the interface circuit that programs (act 705) the interface circuit 440 to receive a first type of signal from the controller for transmission to a component 320, 330, 340 of the machine 350, wherein the first type of signal can be either an analog signal or digital signal. The method 700 may further include receiving (act 710) the first type of signal from an isolating communication controller (e.g., at one of the analog or digital inputs to the programmable interface circuit 440 (AOUT, DOUT, DOUTP, DOUTN)), and transmitting (act 720) an output signal of the first type to a signaling channel (ADIO or ADIO and DIFF) of the programmable interface circuit 440. The transmitted signal can be based on the received first type of signal. A method of signaling between a controller and one or more components of a machine may additionally or alternatively comprise receiving a second programming input to program (act 730) the interface circuit 440 to receive a second type of signal at the signaling channel, wherein the second type of signal is either an analog signal or digital signal, and receiving (act 740) the second type of signal at the signaling channel. The method may further include transmitting (act 750) a signal of the second type to the controller that is based on the received second type of signal. Such a combination of acts may be performed in a talk and listen operation, where the talking is in a first mode and the listening is in a second mode. Alternatively, such a combination of acts may be performed when a signaling channel is repurposed in an existing set-up (e.g., after a change of a component). A method 700 may include further acts associated with further programming of the interface circuit 440 to receive and transmit various types of analog and digital signals (such as single-ended digital, differential digital, single-ended analog, differential analog, voltage-sourced analog, and current-sourced analog signals).

In some implementations, a signaling channel can be reprogrammed during operation to transmit and/or receive different types of analog and digital signals. For example, time-division multiplexing may be implemented with a channel such that during a first period of time, the signaling channel is programmed to transmit a first type of analog signal to a first machine component. During a subsequent second period of time, the same signaling channel may be programmed to transmit a second type of digital signal to a second machine component. A multiplexer (located, for example, at or after a break-out box 318) may be used to route the signals to different components. During a subsequent third period of time, the same signaling channel may be programmed to receive an analog or digital signal. Such time-division multiplexing can allow further multiple different uses of a signaling channel.

Various configurations of programmable interface circuits of the disclosed implementations are possible. Examples of such configurations are listed below.

(1) A programmable interface circuit (440) to adaptively communicate signals between an isolating communication controller (310) and a component (320, 330, 340) of a machine (350), the programmable interface circuit comprising: a plurality of interconnects (401) to receive programming inputs from the isolating communication controller; a signaling channel (452, 454) to carry signals between the programmable interface circuit and the component; a programmable analog I/O circuit (410, 610, 612) to couple to the signaling channel and to receive a first analog signal from the isolating communication controller; a programmable digital I/O circuit (420, 580) to couple to the signaling channel and to receive a first digital signal from the isolating communication controller; and a current-sensing circuit (530) to sense an amount of current flowing in the signaling channel, wherein the programmable interface circuit is programmable during operation, based on at least a first one of the programming inputs applied to the plurality of interconnects, to provide a second analog signal to the signaling channel based on the first analog signal or a second digital signal to the signaling channel based on the first digital signal.

(2) The programmable interface circuit of configuration (1), wherein the programmable interface circuit is programmable based on at least a second one of the programming inputs to receive analog and digital signals through the signaling channel.

(3) The programmable interface circuit of configuration (1) or (2), wherein the programmable interface circuit is programmable based on at least a second one of the programming inputs to transmit at least two different types of analog signals through the signaling channel as the second analog signal.

(4) The programmable interface circuit of configuration (3), wherein a third analog signal of the at least different two types of analog signals is a current-sourced analog signal.

(5) The programmable interface circuit of any one of configurations (1) through (4) 1, wherein the programmable interface circuit further comprises at least one amplification circuit coupled to the signaling channel to provide the second analog and second digital signals transmitted by the signaling channel with an output current from 4 milliamperes (mA) to 24 mA.

(6) The programmable interface circuit of any one of configurations (1) through (5) 1, wherein the programmable interface circuit is programmable based on at least a second one the programming inputs to transmit and receive at least two types of digital signals through the signaling channel.

(7) The programmable interface circuit of any one of configurations (1) through (6) 1, wherein the programmable analog I/O circuit comprises: a first feedback circuit path; a second feedback circuit path; an operational amplifier having a feedback input; and a multiplexer configured to connect the feedback input to the first feedback circuit path or the second feedback circuit path based on at least a second one of the programming inputs.

(8) The programmable interface circuit of configuration (7), wherein the first feedback circuit path senses voltage of the signaling channel and the second feedback circuit path senses the amount of current flowing in the signaling channel.

(9) The programmable interface circuit of any one of configurations (1) through (8) 1, wherein the programmable digital I/O circuit comprises:
a first circuit configured to drive the signaling channel to a logic high level; and
a second circuit configured to drive the signaling channel to a logic low level.

(10) The programmable interface circuit of configuration (9, wherein the second circuit includes a switch to isolate the logic low level from the signaling channel based on at least a second one of the programming inputs.

(11) The programmable interface circuit of any one of configurations (1) through (10) 1, wherein the programmable digital I/O circuit comprises a transceiver connected between one or more of the plurality of interconnects and the signaling channel.

(12) The programmable interface circuit of configuration (11), wherein the transceiver is programmable based on at least a second one of the programming inputs to transmit and receive single-sided and differential digital signals.

(13) The programmable interface circuit of any one of configurations (1) through (12) 1 in combination with the isolating communication controller that connects to the programmable interface circuit via one or more of the plurality of interconnects.

(14) The combination of configuration (13), wherein the isolating communication controller comprises a programmable logic controller or microcontroller.

(15) The combination of configuration (13) or (14), further including the component.

(16) The combination of configuration (15), wherein the component is at least one of a sensor, a motor or actuator, or an imaging apparatus.

Further example configurations are listed below. One or more of dependent aspects (2) through (16) of configuration (1) may be combined with one or more of the following configurations in some implementations.

(17) A programmable interface circuit (440) to adaptively communicate signals between an isolating communication controller (310) and a component (320, 330, 340) of a machine (350), the programmable interface circuit comprising: a plurality of interconnects (401) to receive programming inputs; a signaling channel (452, 454) to carry signals between the programmable interface circuit and the component; a programmable analog I/O circuit (410, 630) having an operational amplifier (522 or 542) to couple to the signaling channel and programmable to receive a first analog signal from the isolating communication controller; and a programmable digital I/O circuit (420) to couple to the signaling channel and programmable to receive a first digital signal from the isolating communication controller, wherein the programmable interface circuit is programmable during operation, based at least on a first one of the programming inputs applied to the plurality of interconnects, to provide a second analog signal to the signaling channel based on the first analog signal or a second digital signal to the signaling channel based on the first digital signal.

(18) The programmable interface circuit of configuration (17), further comprising: a switchable output signal driver to receive the first analog signal in the programmable analog I/O circuit, wherein a feedback signal for the switchable output signal driver is configured to be switched from a current-sensing mode to a voltage-sensing mode based on at least a second one of the programming inputs.

(19) The programmable interface circuit of configuration (18), wherein the switchable output signal driver comprises the operational amplifier.

(20) The programmable interface circuit of configuration (18), further comprising a current sensing circuit to sense an amount of current flowing in the signaling channel and provide the feedback signal for the switchable output signal driver in the current-sensing mode.

(21) The programmable interface circuit of any one of configurations (17) through (20), further comprising a switchable receive signal driver in the programmable analog I/O circuit that includes an amplifier configured to be switched between a single-ended amplifier and a differential amplifier.

(22) The programmable interface circuit of any one of configurations (17) through (21), wherein the programmable interface circuit is further programmable based on at least a second one of the programming inputs to receive analog and digital signals through the signaling channel.

(23) The programmable interface circuit of any one of configurations (17) through (22), wherein the programmable interface circuit is programmable based on at least a second one of the programming inputs to transmit analog signals of at least two different signaling types through the signaling channel.

(24) The programmable interface circuit of any one of configurations (17) through (23), wherein the programmable interface circuit is programmable based on the programming inputs to transmit and receive at least two types of digital signals through the signaling channel.

(25) The programmable interface circuit of any one of configurations (17) through (24), further comprising a programmable signal routing and isolation circuit to couple the programmable analog I/O circuit and the programmable digital I/O circuit to the signaling channel.

(26) The programmable interface circuit of any one of configurations (17) through (25), wherein the programmable signal routing and isolation circuit includes a transistor to isolate at least a portion of the programmable digital I/O circuit from the signaling channel.

(27) The programmable interface circuit of any one of configurations (17) through (26) in combination with the isolating communication controller that connects to the programmable interface circuit via one or more of the plurality of interconnects.

(28) The combination of configuration (27), wherein the isolating communication controller comprises a programmable logic controller or microcontroller.

(29) The combination of configuration (27) or (28), further including the component.

The following configuration may be implemented in combination with aspects of configurations (2) through (16) and (18) through (29).

(30) A programmable interface circuit (440) to adaptively communicate signals between an isolating communication controller (310) and a component (320, 330, 340) of a machine (350), the programmable interface circuit comprising: a plurality of interconnects (401) to receive programming inputs; a signaling channel (452, 454) to carry signals between the programmable interface circuit and the component; a programmable analog I/O circuit (410, 630) to couple to the signaling channel and programmable to receive a first analog signal from the isolating communication controller; and a programmable digital I/O circuit (420) to couple to the signaling channel and programmable to receive a first digital signal from the isolating communication controller, wherein the programmable analog I/O circuit comprises: a first feedback circuit path; a second feedback circuit path; an operational amplifier having a feedback input; and a multiplexer to connect the feedback input to the first feedback circuit path or the second feedback circuit path based on at least a first one of the programming inputs.

Various methods of operating programmable interface circuits of the above-listed configurations may be implemented. Examples of such methods are listed below.

(31) A method of operating a programmable interface circuit (440), the method comprising: receiving a first programming input that programs (705) an interface circuit to receive a first signal from an isolating communication controller (310) for transmission to a component (320, 325, 330, 340) of a machine (350), wherein the first signal can be either an analog signal or a digital signal; receiving (710) the first signal from the isolating communication controller; transmitting (720) a first output signal that is based on the received first signal to a signaling channel of the programmable interface circuit, wherein the first output signal is of a same signaling type as the received first signal; receiving a second programming input that programs (730) the interface circuit to receive a second signal from the component at the signaling channel, wherein the second signal is of a different signaling type than the first signal; receiving (740) the second signal at the signaling channel; and transmitting (750) a first input signal to the isolating communication controller that is based on the received second signal.

(32) The method of (31), wherein the first signal is a differential analog signal.

(33) The method of (31) or (32), wherein the first signal is a current-sourced analog signal having an amplitude between 4 mA and 24 mA.

(34) The method of any one of (31) through (33), wherein the first signal is a differential digital signal.

(35) The method of any one of (31) through (34), wherein the first signal is a low-voltage differential digital signal.

(36) The method of any one of (31) through (36), wherein the second signal is a standardized network communications signal that requires two or four signaling wires.

(37) The method of any one of (31) through (37), wherein the second signal is a differential analog signal.

(38) The method of any one of (31) through (38), wherein the second signal is a current-sourced analog signal having an amplitude between 4 mA and 24 mA.

(39) The method of any one of (31) through (39), wherein the second signal is a differential digital signal.

(40) The method of any one of (31) through (40), wherein the second signal is a low-voltage differential digital signal.

(41) The method of any one of (31) through (41), wherein the first signal is a current-sourced analog signal and the second signal is a voltage-sourced analog signal.

(42) The method of any one of (31) through (42), wherein transmitting the first output signal comprises selecting a feedback circuit for an operational amplifier in the programmable interface circuit based at least upon the first programming input.

(43) The method of any one of (31) through (43), wherein receiving the second signal comprises selecting between a single-ended amplification mode or differential amplification mode for an operational amplifier in the programmable interface circuit based at least upon the second programming input.

(44) The method of any one of (31) through (44), wherein transmitting the first input signal to the isolating communication controller comprises electrically isolating at least a portion of programmable digital I/O circuitry from the signaling channel.

(45) The method of any one of (31) through (45), wherein transmitting the first input signal to the isolating communication controller comprises electrically isolating at least a portion of programmable analog I/O circuitry from the signaling channel.

While various inventive implementations have been described and illustrated herein, those of ordinary skill in the art will readily envision a variety of other means and/or structures for performing the functions and/or obtaining the results and/or one or more of the advantages described herein, and each of such variations and/or modifications, is deemed to be within the scope of the inventive implementations described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive implementations described herein. It is, therefore, to be understood that the foregoing implementations are presented by way of example only and that, within the scope of the appended claims and equivalents thereto, inventive implementations may be practiced otherwise than as specifically described and claimed. Inventive implementations of the present disclosure are directed to each individual feature, system, article, material, and/or method described herein. In addition, any combination of two or more such features, systems, articles, materials, and/or methods, if such features, systems, articles, materials, and/or methods are not mutually inconsistent, is included within the inventive scope of the present disclosure.

The above-described implementations can be implemented in any of numerous ways. For example, the implementations may be implemented using hardware, software or a combination thereof. When implemented in software, the software code can be executed on any suitable processor or collection of processors, whether provided in a single computer or distributed among multiple computers.

Also, various inventive concepts may be embodied as one or more methods, of which an example has been provided. The acts performed as part of the method may be ordered in any suitable way. Accordingly, implementations may be constructed in which acts are performed in an order different than illustrated, which may include performing some acts simultaneously, even though shown as sequential acts in illustrative implementations.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one implementation, to A only (optionally including elements other than B); in another implementation, to B only (optionally including elements other than A); in yet another implementation, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one implementation, to at least one, optionally including more than one, A, with no B present (and optionally including elements other than B); in another implementation, to at least one, optionally including more than one, B, with no A present (and optionally including elements other than A); in yet another implementation, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The terms "about," "approximately," and "substantially" may be used to refer to a value (such as a target value or values used in numerical ranges), and are intended to encompass the referenced value plus and minus variations that would be considered to be within the scope of the inventive implementations. The amount of variation could be as much as ±5% in some implementations, as much as ±10% in some implementations, and yet as much as ±20% of the listed value(s) in some implementations. The term "essentially" is used to refer to a value that may vary by no more than ±3%.

What is claimed is:

1. A programmable interface circuit to adaptively communicate signals between an isolating communication controller and a component of a machine, the programmable interface circuit comprising:
   a plurality of interconnects to receive programming inputs from the isolating communication controller;
   a signaling channel to carry signals between the programmable interface circuit and the component;
   a programmable analog I/O circuit to couple to the signaling channel and to receive a first analog signal from the isolating communication controller;
   a programmable digital I/O circuit to couple to the signaling channel and to receive a first digital signal from the isolating communication controller; and
   a current-sensing circuit to sense an amount of current flowing in the signaling channel,
   wherein the programmable interface circuit is programmable during operation, based on at least a first one of the programming inputs applied to the plurality of interconnects, to provide a second analog signal to the signaling channel based on the first analog signal or a second digital signal to the signaling channel based on the first digital signal.

2. The programmable interface circuit of claim 1, wherein the programmable interface circuit is programmable based on at least a second one of the programming inputs to receive analog and digital signals through the signaling channel.

3. The programmable interface circuit of claim 1, wherein the programmable interface circuit is programmable based on at least a second one of the programming inputs to transmit at least two different types of analog signals through the signaling channel as the second analog signal.

4. The programmable interface circuit of claim 3, wherein a third analog signal of the at least two different types of analog signals is a current-sourced analog signal.

5. The programmable interface circuit of claim 1, wherein the programmable interface circuit further comprises at least one amplification circuit coupled to the signaling channel to provide the second analog and second digital signals transmitted by the signaling channel with an output current from 4 milliamperes (mA) to 24 mA.

6. The programmable interface circuit of claim 1, wherein the programmable interface circuit is programmable based on at least a second one of the programming inputs to transmit and receive at least two types of digital signals through the signaling channel.

7. The programmable interface circuit of claim 1, wherein the programmable analog I/O circuit comprises:
   a first feedback circuit path;
   a second feedback circuit path;
   an operational amplifier having a feedback input; and
   a multiplexer configured to connect the feedback input to the first feedback circuit path or the second feedback circuit path based on at least a second one of the programming inputs.

8. The programmable interface circuit of claim 7, wherein the first feedback circuit path senses voltage of the signaling channel and the second feedback circuit path senses the amount of current flowing in the signaling channel.

9. The programmable interface circuit of claim 1, wherein the programmable digital I/O circuit comprises:
   a first circuit configured to drive the signaling channel to a logic high level; and
   a second circuit configured to drive the signaling channel to a logic low level.

10. The programmable interface circuit of claim 9, wherein the second circuit includes a switch to isolate the logic low level from the signaling channel based on at least a second one of the programming inputs.

11. The programmable interface circuit of claim 1, wherein the programmable digital I/O circuit comprises a transceiver connected between one or more of the plurality of interconnects and the signaling channel.

12. The programmable interface circuit of claim 11, wherein the transceiver is programmable based on at least a second one of the programming inputs to transmit and receive single-sided and differential digital signals.

13. The programmable interface circuit of claim 1 in combination with the isolating communication controller that connects to the programmable interface circuit via one or more of the plurality of interconnects.

14. The combination of claim 13, wherein the isolating communication controller comprises a programmable logic controller or microcontroller.

15. The combination of claim 13, further including the component.

16. The combination of claim 15, wherein the component is at least one of a sensor, a motor or actuator, or an imaging apparatus.

17. A programmable interface circuit to adaptively communicate signals between an isolating communication controller and a component of a machine, the programmable interface circuit comprising:
a plurality of interconnects to receive programming inputs;
a signaling channel to carry signals between the programmable interface circuit and the component;
a programmable analog I/O circuit having an operational amplifier to couple to the signaling channel and programmable to receive a first analog signal from the isolating communication controller; and
a programmable digital I/O circuit to couple to the signaling channel and programmable to receive a first digital signal from the isolating communication controller,
wherein the programmable interface circuit is programmable during operation, based at least on a first one of the programming inputs applied to the plurality of interconnects, to provide a second analog signal to the signaling channel based on the first analog signal or a second digital signal to the signaling channel based on the first digital signal.

18. The programmable interface circuit of claim 17, further comprising: a switchable output signal driver to receive the first analog signal in the programmable analog I/O circuit, wherein a feedback signal for the switchable output signal driver is configured to be switched from a current-sensing mode to a voltage-sensing mode based on at least a second one of the programming inputs.

19. The programmable interface circuit of claim 18, wherein the switchable output signal driver comprises the operational amplifier.

20. The programmable interface circuit of claim 18, further comprising a current sensing circuit to sense an amount of current flowing in the signaling channel and provide the feedback signal for the switchable output signal driver in the current-sensing mode.

21. The programmable interface circuit of claim 17, further comprising a switchable receive signal driver in the programmable analog I/O circuit that includes an amplifier configured to be switched between a single-ended amplifier and a differential amplifier.

22. The programmable interface circuit of claim 17, wherein the programmable interface circuit is further programmable based on at least a second one of the programming inputs to receive analog and digital signals through the signaling channel.

23. The programmable interface circuit of claim 17, wherein the programmable interface circuit is programmable based on at least a second one of the programming inputs to transmit analog signals of at least two different signaling types through the signaling channel.

24. The programmable interface circuit of claim 17, wherein the programmable interface circuit is programmable based on the programming inputs to transmit and receive at least two types of digital signals through the signaling channel.

25. The programmable interface circuit of claim 17, further comprising a programmable signal routing and isolation circuit to couple the programmable analog I/O circuit and the programmable digital I/O circuit to the signaling channel.

26. The programmable interface circuit of claim 17, wherein the programmable signal routing and isolation circuit includes a transistor to isolate at least a portion of the programmable digital I/O circuit from the signaling channel.

27. The programmable interface circuit of claim 17 in combination with the isolating communication controller that connects to the programmable interface circuit via one or more of the plurality of interconnects.

28. The combination of claim 27, wherein the isolating communication controller comprises a programmable logic controller or microcontroller.

29. The combination of claim 27, further including the component.

30. A programmable interface circuit to adaptively communicate signals between an isolating communication controller and a component of a machine, the programmable interface circuit comprising:
a plurality of interconnects to receive programming inputs;
a signaling channel to carry signals between the programmable interface circuit and the component;
a programmable analog I/O circuit to couple to the signaling channel and programmable to receive a first analog signal from the isolating communication controller; and
a programmable digital I/O circuit to couple to the signaling channel and programmable to receive a first digital signal from the isolating communication controller, wherein the programmable analog I/O circuit comprises:
a first feedback circuit path;
a second feedback circuit path;
an operational amplifier having a feedback input; and
a multiplexer to connect the feedback input to the first feedback circuit path or the second feedback circuit path based on at least a first one of the programming inputs.

31. The programmable interface circuit of claim 30, further comprising:
a current-sensing circuit to sense a current flowing in the signaling channel, wherein the second feedback circuit path connects to an output from the current-sensing circuit.

32. The programmable interface circuit of claim 30, wherein the programmable interface circuit is programmable based on at least a second one of the programming inputs to receive analog and digital signals through the signaling channel.

33. The programmable interface circuit of claim 30, wherein the programmable interface circuit is programmable based on at least a second one of the programming inputs to transmit at least two different types of analog signals through the signaling channel as a second analog signal that is based on the first analog signal.

34. The programmable interface circuit of claim 30, wherein the programmable interface circuit further comprises at least one amplification circuit coupled to the signaling channel to provide an output signal transmitted by the signaling channel with an output current from 4 milliamperes (mA) to 24 mA.

35. The programmable interface circuit of claim 30, wherein the programmable interface circuit is programmable based on at least a second one of the programming inputs to transmit and receive at least two types of digital signals through the signaling channel.

36. A method of operating a programmable interface circuit, the method comprising:
  receiving a first programming input that programs an interface circuit to receive a first signal from an isolating communication controller for transmission to a component of a machine, wherein the first signal can be either an analog signal or a digital signal;
  receiving the first signal from the isolating communication controller;
  transmitting a first output signal that is based on the received first signal to a signaling channel of the programmable interface circuit, wherein the first output signal is of a same signaling type as the received first signal;
  receiving a second programming input that programs the interface circuit to receive a second signal from the component at the signaling channel, wherein the second signal is of a different signaling type than the first signal;
  receiving the second signal at the signaling channel; and
  transmitting a first input signal to the isolating communication controller that is based on the received second signal.

37. The method of claim 36, wherein the first signal is a differential analog signal.

38. The method of claim 36, wherein the first signal is a current-sourced analog signal having an amplitude between 4 mA and 24 mA.

39. The method of claim 36, wherein the first signal is a differential digital signal.

40. The method of claim 36, wherein the first signal is a low-voltage differential digital signal.

41. The method of claim 36, wherein the second signal is a standardized network communications signal that requires two or four signaling wires.

42. The method of claim 36, wherein the second signal is a differential analog signal.

43. The method of claim 36, wherein the second signal is a current-sourced analog signal having an amplitude between 4 mA and 24 mA.

44. The method of claim 36, wherein the second signal is a differential digital signal.

45. The method of claim 36, wherein the second signal is a low-voltage differential digital signal.

46. The method of claim 36, wherein the first signal is a current-sourced analog signal and the second signal is a voltage-sourced analog signal.

47. The method of claim 36, wherein transmitting the first output signal comprises selecting a feedback circuit for an operational amplifier in the programmable interface circuit based at least upon the first programming input.

48. The method of claim 36, wherein receiving the second signal comprises selecting between a single-ended amplification mode or differential amplification mode for an operational amplifier in the programmable interface circuit based at least upon the second programming input.

49. The method of claim 36, wherein transmitting the first input signal to the isolating communication controller comprises electrically isolating at least a portion of programmable digital I/O circuitry from the signaling channel.

50. The method of claim 36, wherein transmitting the first input signal to the isolating communication controller comprises electrically isolating at least a portion of programmable analog I/O circuitry from the signaling channel.

* * * * *